(12) United States Patent
Xu et al.

(10) Patent No.: US 12,177,007 B2
(45) Date of Patent: Dec. 24, 2024

(54) NETWORK CODING DESIGN FOR LOW-LATENCY COMMUNICATIONS

(71) Applicant: QUALCOMM Incorporated, San Diego, CA (US)

(72) Inventors: Changlong Xu, Beijing (CN); Ruiming Zheng, Beijing (CN); Tao Luo, San Diego, CA (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 406 days.

(21) Appl. No.: 17/753,115

(22) PCT Filed: Aug. 17, 2020

(86) PCT No.: PCT/CN2020/109485
§ 371 (c)(1),
(2) Date: Feb. 18, 2022

(87) PCT Pub. No.: WO2021/032046
PCT Pub. Date: Feb. 25, 2021

(65) Prior Publication Data
US 2022/0337337 A1    Oct. 20, 2022

(30) Foreign Application Priority Data
Aug. 18, 2019  (WO) ............... PCT/CN2019/101242

(51) Int. Cl.
*H04L 1/00*    (2006.01)
(52) U.S. Cl.
CPC .......... *H04L 1/0009* (2013.01); *H04L 1/0041* (2013.01); *H04L 1/0045* (2013.01); *H04L 1/0076* (2013.01)

(58) Field of Classification Search
USPC ....................................................... 370/328
See application file for complete search history.

(56) References Cited

U.S. PATENT DOCUMENTS 8,514,779 B2 *  8/2013  Ozturk ................. H04L 1/0007
                                                      370/328
9,590,832 B1 *  3/2017  Zhang ................. H04L 27/2647
(Continued)

FOREIGN PATENT DOCUMENTS

CN     102625250 A     8/2012
CN     105764144 A     7/2016
(Continued)

OTHER PUBLICATIONS

International Search Report and Written Opinion—PCT/CN2019/101242—ISAEPO—May 22, 2020.
(Continued)

*Primary Examiner* — Benjamin H Elliott, IV
*Assistant Examiner* — Hooman Houshmand
(74) *Attorney, Agent, or Firm* — Arent Fox, LLP

(57) ABSTRACT

An apparatus, such as a base station, may determine channel conditions associated with at least two carriers on which communication with another apparatus is configured. The apparatus may encode a dataset into a set of protocol data units (PDUs) using fountain coding based on the channel conditions. The apparatus may send a first subset of the set of PDUs to the other apparatus on a first carrier of the at least two carriers. The apparatus may send a second subset of the set of PDUs to the other apparatus on a second carrier of the at least two carriers. Another apparatus, such as a user equipment (UE), may receive the set of PDUs from the apparatus over the at least two carriers, and may decode the set of PDUs to obtain a dataset using fountain coding.

31 Claims, 12 Drawing Sheets

(56) References Cited

U.S. PATENT DOCUMENTS

| | | | |
|---|---|---|---|
| 11,949,434 B2* | 4/2024 | Xu | H04L 1/0041 |
| 2009/0196294 A1* | 8/2009 | Black | H04L 47/10 |
| | | | 370/394 |
| 2009/0257387 A1* | 10/2009 | Gholmieh | H04L 5/0091 |
| | | | 370/329 |
| 2010/0100792 A1* | 4/2010 | Abu-Surra | H03M 13/6525 |
| | | | 714/755 |
| 2010/0215006 A1* | 8/2010 | Ho | H04L 1/1848 |
| | | | 370/329 |
| 2012/0057560 A1* | 3/2012 | Park | H04L 1/1887 |
| | | | 370/328 |
| 2012/0117446 A1* | 5/2012 | Taghavi Nasrabadi | |
| | | | H04L 1/0041 |
| | | | 714/776 |
| 2013/0044835 A1* | 2/2013 | Sevin | H04L 1/06 |
| | | | 375/295 |
| 2014/0369250 A1* | 12/2014 | Ren | H04W 4/06 |
| | | | 370/312 |
| 2015/0181638 A1* | 6/2015 | Tabet | H04W 28/085 |
| | | | 370/329 |
| 2017/0118673 A1* | 4/2017 | Narasimha | H04L 1/0011 |
| 2017/0332400 A1* | 11/2017 | Kowalski | H04L 1/0003 |
| 2018/0206174 A1* | 7/2018 | Zhou | H04B 1/0483 |
| 2018/0376457 A1* | 12/2018 | Tseng | H04W 36/0072 |
| 2019/0081746 A1* | 3/2019 | Han | H04L 1/1896 |
| 2019/0097754 A1* | 3/2019 | Yu | H04L 1/0009 |

FOREIGN PATENT DOCUMENTS

| | | |
|---|---|---|
| WO | 2015127597 A1 | 9/2015 |
| WO | 2018121863 A1 | 7/2018 |

OTHER PUBLICATIONS

International Search Report and Written Opinion—PCT/CN2020/109485—ISA/EPO—Sep. 29, 2020.

Spreadtrum Communications: "On L1-RSRP Report for Beam Management", 3GPP Draft, 3GPP TSG RAN WG1 Meeting #90, R1-1713050, Prague, Czech Rep. Aug. 21-25, 2017, Aug. 25, 2017 (Aug. 25, 2017), 6 Pages, Sections 1-4.

Supplementary European Search Report—EP20854686—Search Authority—Munich—Jul. 14, 2023.

* cited by examiner

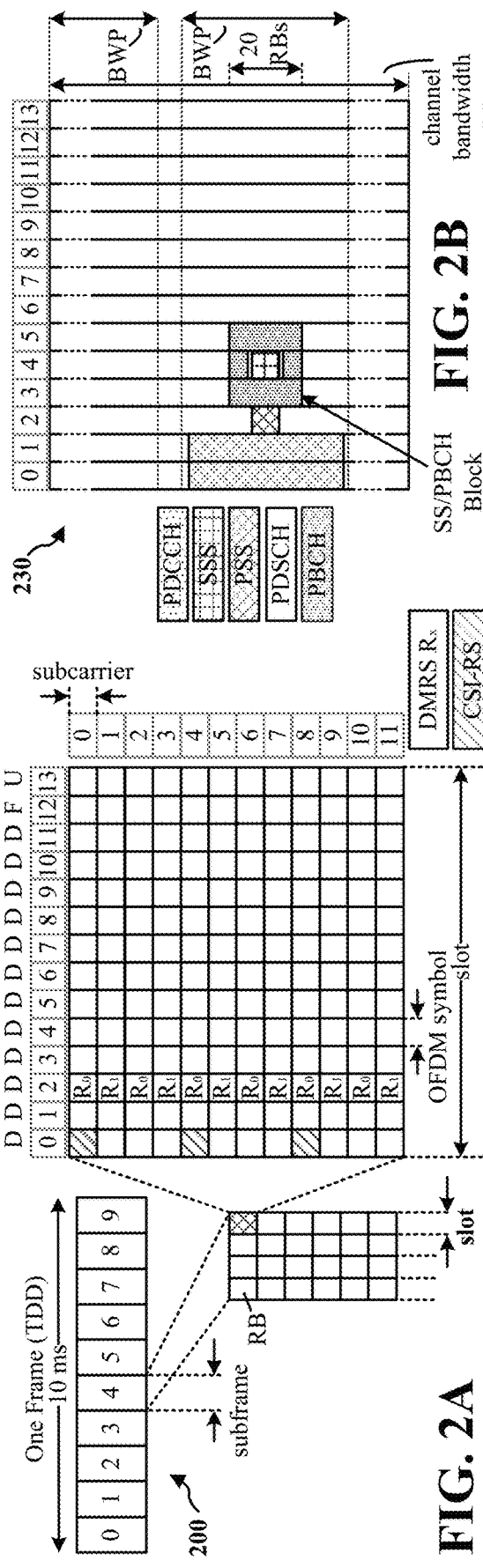
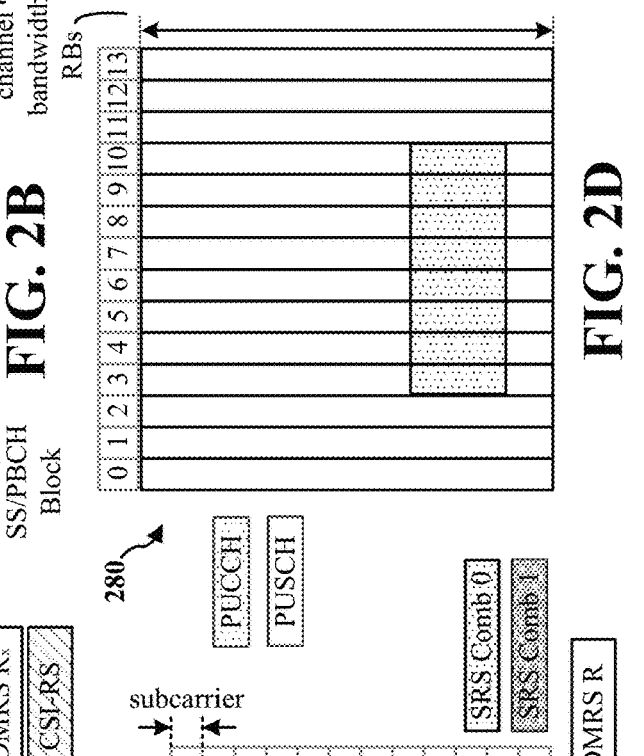
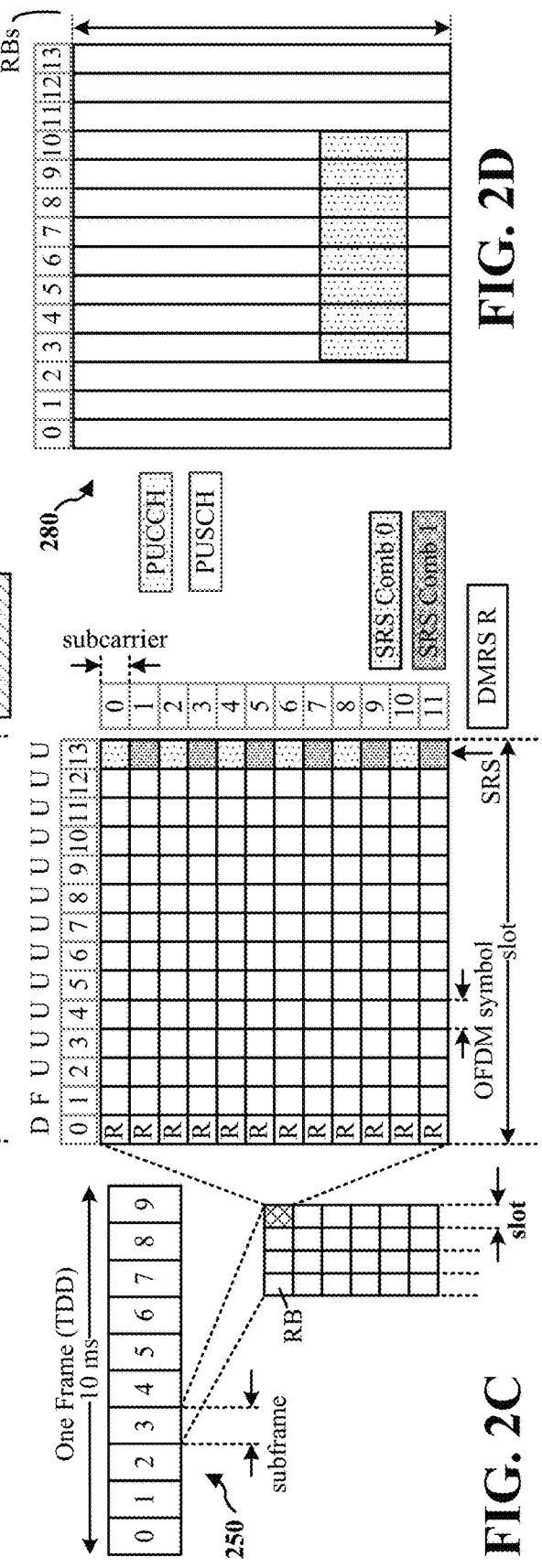
FIG. 2A
FIG. 2B
FIG. 2C
FIG. 2D

NETWORK CODING DESIGN FOR LOW-LATENCY COMMUNICATIONS

CROSS REFERENCE TO RELATED APPLICATION(S)

This application is a national phase entry of PCT Application No. PCT/CN2020/109485, entitled "NETWORK CODING DESIGN" and filed on Aug. 17, 2020, which claims priority to PCT Application No. PCT/CN2019/101242, entitled "NETWORK CODING DESIGN" and filed on Aug. 18, 2019, both of which are expressly incorporated by reference herein in their entirety.

BACKGROUND

Technical Field

The present disclosure generally relates to communication systems, and more particularly, to wireless communication apparatuses configured to encode a dataset using fountain coding.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Various technologies have been introduced to generally improve wireless communications. For example, carrier aggregation may increase data rate per user equipment (UE) by assigning multiple component carriers to the same UE. Similarly, dual connectivity may assign multiple component carriers to the same UE, but from two cells or cell groups. While both dual connectivity and carrier aggregation may improve some aspects of communication between wireless communication apparatuses, such as by increasing throughput speed and/or amount, some issues may arise when dual connectivity or carrier aggregation are configured in practice. In some scenarios, dual connectivity and carrier aggregation may be relatively inefficient and/or wasteful when sending protocol data units (PDUs), such as PDU of a packet data convergence protocol (PDCP) layer. For example, sending the same set of PDUs over each of the at least two carriers may increase the overhead associated with over-the-air signaling, as well as processing and/or transmission. Further, the receiving apparatus may discard duplicate PDUs (regardless of which carrier the PDU is received on), thereby increasing the wastefulness of PDU duplication.

This redundancy of PDUs may be wasteful because at least approximately twice as many resources may be consumed at lower layers, such as the physical (PHY) and/or media access control (MAC) layer(s). The consumption (and potential waste) of resources due to PDU duplication may be increased when channel conditions (e.g., physical channel conditions) between a transmitting apparatus and a receiving apparatus are relatively poor (e.g., requiring additional retransmissions).

In addition, out-of-order PDU delivery to the receiving apparatus from the transmitting apparatus when duplicating PDCP PDUs for dual connectivity and/or carrier aggregation may increase latency. Such a latency increase may be detrimental to ultra-reliable low-latency communications (URLLC) and/or other low-latency services or use cases. Thus, a need exists to improve communication of PDUs using dual connectivity and/or carrier aggregation.

The present disclosure describes various techniques and solutions for improving communication of PDUs, such as PDUs communicated using dual connectivity and/or carrier aggregation. For example, the present disclosure provides for encoding a dataset from at least one service data unit (SDU) using fountain coding in order to mitigate one or more of the aforementioned issues potentially arising due to dual connectivity and/or carrier aggregation, such as by reducing wastefulness and/or decreasing latency due to out-of-order PDU delivery. In some aspects of the present disclosure, encoding a dataset from at least one SDU using fountain coding may obviate the need for in-order PDU delivery because fountain coding may not rely on in-order reception of PDUs. In addition, the overhead associated with over-the-air signaling and/or computational processing may be reduced because the total size of the PDUs received by the receiving apparatus may be only slightly larger than the total sizes of the original PDUs generated by the transmitting apparatus. Further, wastefulness may be reduced because all the received PDUs may be used for decoding by the receiving apparatus, regardless of the carrier on which a PDU is received.

In an aspect of the disclosure, a method, a computer-readable medium, and an apparatus are provided. The apparatus may be a base station. The apparatus may determine channel conditions associated with at least two carriers on which communication with another apparatus is configured. The apparatus may encode a dataset into a set of protocol data units (PDUs) using fountain coding based on the channel conditions. The apparatus may send a first subset of the set of PDUs to the other apparatus on a first carrier of the at least two carriers. The apparatus may send a second subset of the set of PDUs to the other apparatus on a second carrier of the at least two carriers.

In another aspect of the disclosure, a method, a computer-readable medium, and an apparatus are provided. The apparatus may be a UE. The apparatus may receive a set of PDUs from another apparatus over at least two carriers configured for communication with the other apparatus. The apparatus may decode the set of PDUs to obtain a dataset using fountain coding. The apparatus may provide the dataset to an upper layer of the apparatus.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 2A is a diagram illustrating an example of a first frame, in accordance with various aspects of the present disclosure.

FIG. 2B is a diagram illustrating an example of DL channels within a subframe, in accordance with various aspects of the present disclosure.

FIG. 2C is a diagram illustrating an example of a second frame, in accordance with various aspects of the present disclosure.

FIG. 2D is a diagram illustrating an example of UL channels within a subframe, in accordance with various aspects of the present disclosure.

DETAILED DESCRIPTION

Figure 1:
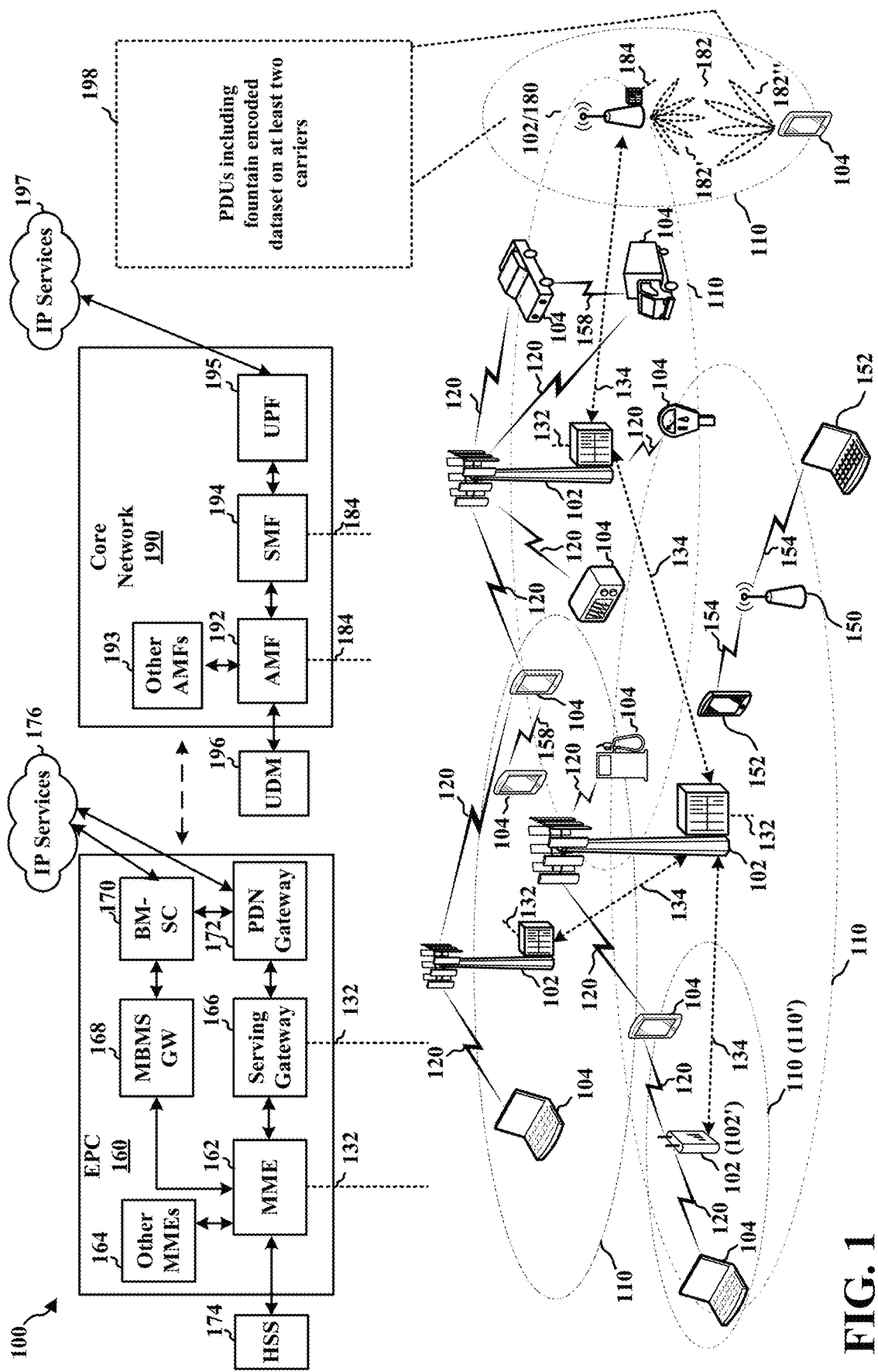
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, user equipment(s) (UE) 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G Long Term Evolution (LTE) (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G New Radio (NR) (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y megahertz (MHz) (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 gigahertz (GHz) unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides Quality of Service (QoS) flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Although the present disclosure may focus on 5G NR, the concepts and various aspects described herein may be applicable to other similar areas, such as LTE, LTE-Advanced (LTE-A), Code Division Multiple Access (CDMA), Global System for Mobile communications (GSM), or other wireless/radio access technologies.

Referring again to FIG. 1, in certain aspects, in certain aspects, the base station 102/180 may encode a dataset using fountain coding into a set of encoded packets. The base station 102/180 may include the set of encoded packets in a set of protocol data units (PDUs) 198. The base station 102/180 may send a first subset of the set of PDUs 198 to the UE 104 on a first carrier of at least two carriers configured for communication between the base station 102/180 and the UE 104. The base station 102/180 may send a second subset of the set of PDUs 198 to the UE 104 on a second carrier of the at least two carriers. The UE 104 may receive the first and second subsets of the set of PDUs 198 on the first and second carriers, respectively. The UE 104 may decode the encoded packets in the set of PDUs 198 based on fountain coding to obtain the original dataset.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

Other wireless communication technologies may have a different frame structure and/or different channels. A frame, e.g., of 10 milliseconds (ms), may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) orthogonal frequency-division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies $\mu$ 0 to 4 allow for 1, 2, 4, 8, and 16 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and $2^\mu$ slots/subframe. The subcarrier spacing and symbol length/duration are a function of the numerology. The subcarrier spacing may be equal to $2^\mu*15$ kilohertz (kHz), where $\mu$ is the numerology 0 to 4. As such, the numerology $\mu=0$ has a subcarrier spacing of 15 kHz and the numerology $\mu=4$ has a subcarrier spacing of 240 kHz. The symbol length/duration is inversely related to the subcarrier spacing. FIGS. 2A-2D provide an example of slot configuration 0 with 14 symbols per slot and numerology $\mu=2$ with 4 slots per subframe. The slot duration is 0.25 ms, the subcarrier spacing is 60 kHz, and the symbol duration is approximately 16.67 $\mu$s. Within a set of frames, there may be one or more different bandwidth parts (BWPs) (see FIG. 2B) that are frequency division multiplexed. Each BWP may have a particular numerology.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A PDCCH within one BWP may be referred to as a control resource set (CORESET). Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgement (ACK)/non-acknowledgement (NACK) feedback. The PUSCH carries data, and may additionally be used to carry a buffer status report (BSR), a power headroom report (PHR), and/or UCI.

Figure 3:
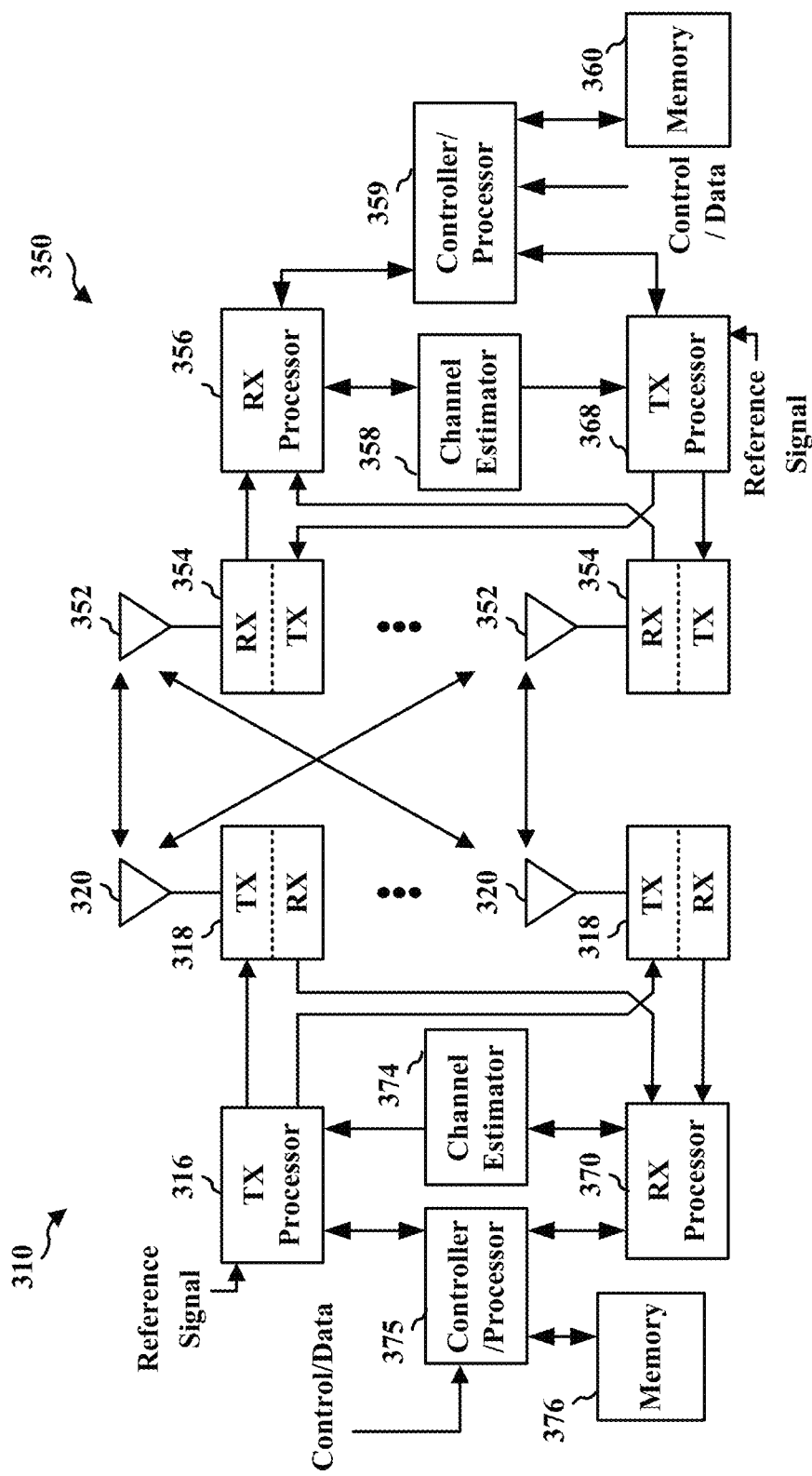
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

In some aspects, at least one of the TX processor 368, the RX processor 356, and the controller/processor 359 may be configured to perform aspects in connection with 198 of FIG. 1.

In some other aspects, at least one of the TX processor 316, the RX processor 370, and the controller/processor 375 may be configured to perform aspects in connection with 198 of FIG. 1.

Now referring to FIGS. 4-12, techniques and approaches to encoding a dataset using fountain codes is described. Briefly, fountain codes are erasure codes that are rate-less. Fountain codes are designed to allow a receiving apparatus to recover the original source dataset (e.g., a set of symbols) using an encoded dataset (e.g., an encoded set of symbols) that is equal to or only marginally larger (e.g., less than two times) than the original source dataset. Examples of fountain codes include Raptor codes and Luby transform (LT) codes.

Figure 4:
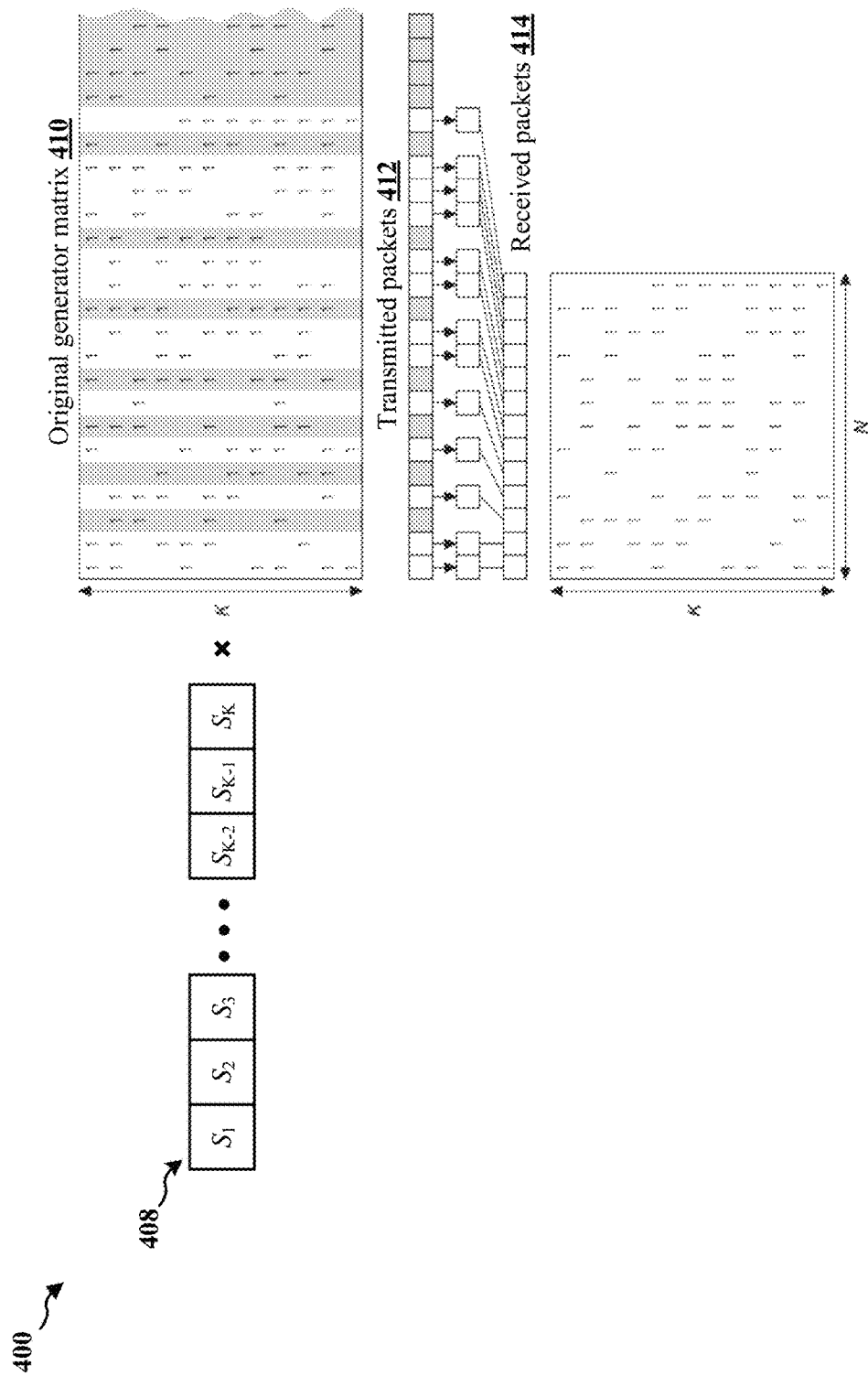
FIG. 4 is a diagram illustrating a system for encoding a dataset using fountain coding.

With reference to FIG. 4, a diagram illustrates a system 400 for encoding a dataset 408 using fountain coding. A dataset 408 may include a set of bits or symbols that is to be transmitted over a RAN to a receiving apparatus. The dataset 408 may include data and/or control information.

The dataset 408 to be encoded may be obtained at one layer of a transmitting apparatus as a set of SDUs $s_1, s_2, \ldots, s_{K-1}, s_K$. In order to encode the dataset 408, a transmitting apparatus may first determine an original generator matrix 410. The original generator matrix 410 may include K rows, but may include a potentially unlimited number of columns. For network coding, then, a submatrix of the original generator matrix 410 may be determined. The submatrix may be known as a generator matrix G.

The transmitting apparatus may determine the generator matrix G as a submatrix of an original generator matrix 410 (also known as a mother generator matrix). As a submatrix of the original generator matrix 410, the generator matrix G may be the K columns of the original generator matrix 410 and the first N columns of the original generator matrix 410. In addition, the generator matrix G may be invertible with minimum N.

To encode the dataset 408 based on the generator matrix, the transmitting apparatus may multiply an entry (e.g., a bit or symbol) of the dataset with each entry of a column of a generator matrix G that corresponds to an index of the packet to be transmitted, and summing the products.

Thus, to obtain a packet $p_j$ of the transmitted packets 412, the transmitting apparatus may multiply an entry $s_k$ (e.g., a bit or symbol) of the dataset 408 with each row entry of one column of the generator matrix G that corresponds to the index j of the packet $p_j$ to be transmitted, and summing the products, as shown in Equation 1.

$$p_j = \Sigma_{k=1}^{K} s_k G_{kj} \qquad \text{(Equation 1)}$$

Correspondingly, the generator matrix G is invertible and/or the rank of the generator matrix G is K, which may allow the receiving apparatus to recover each original entry (e.g., an original bit or symbol) of the dataset from each encoded entry (e.g., an encoded bit or symbol) received in a packet p. Thus, the receiving apparatus may recover an entry $d_k$ (e.g., an original bit or symbol) from a packet $p_n$ of the received packets 414 by multiplying the encoded entry included in the packet $p_n$ with each row entry of one column of the inverse of the generator matrix $G^{-1}$ that corresponds to an index k of the entry $d_k$ that is to be recovered, and summing the products, as shown in Equation 2.

$$d_k = \Sigma_{n=1}^{N} p_n G_{nk}^{-1} \qquad \text{(Equation 2)}$$

The original generator matrix 410 may be determined by both the transmitting and receiving apparatuses. For example, the transmitting apparatus may generate the original generator matrix 410 and then send the original generator matrix 410 to the receiving apparatus. Alternatively, the original generator matrix 410 may be preconfigured in at least one of the transmitting and/or receiving apparatuses. For example, the original generator matrix 410 may be defined by at least one standard or technical specification promulgated by 3GPP. In some aspects, such as for conventional ARQ, the original generator matrix 410 may begin with the unit matrix.

Figure 5:
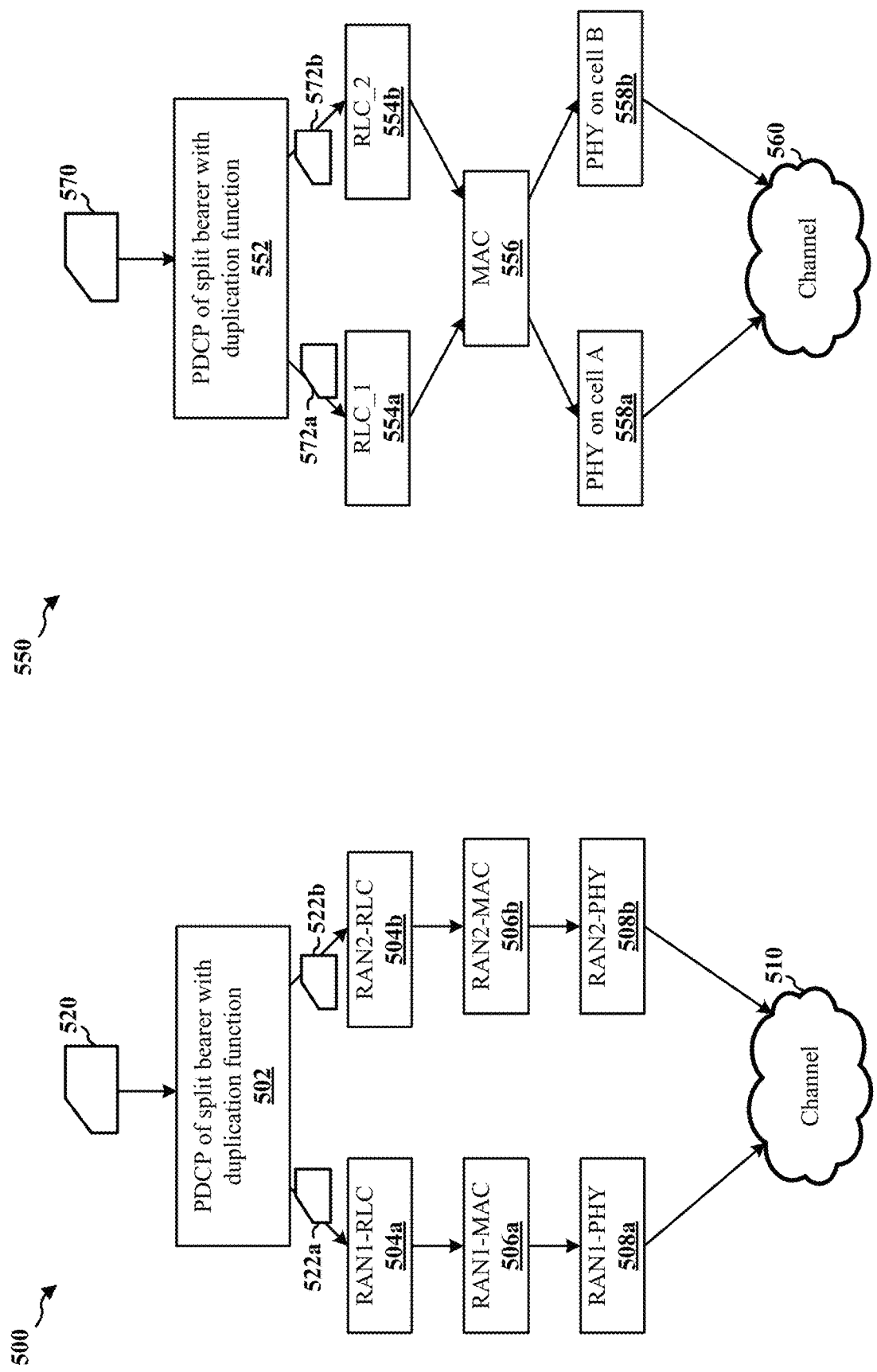
FIG. 5 is a diagram illustrating radio protocol stacks configured for dual connectivity and for carrier aggregation.

Now referring to FIG. 5, two radio protocol stacks 500, 550 of a transmitting apparatus are illustrated. Each radio protocol stack 500, 550 may include a respective PDCP layer 502, 552. Each PDCP layer 502, 552 may be configured to obtain an SDU 520, 570 from a relatively higher layer (e.g., an application layer or a relatively higher layer of the radio protocol stack) and, further, may be configured to process the SDU 520, 570 by duplicating data or control information from the SDU 520, 570 into at least two PDUs 522a, 522b, 572a, 572b to be respectively sent on one of the at least two carriers.

The first radio protocol stack 500 may allow dual connectivity for communication with a receiving apparatus. Dual connectivity may include two carriers: one of which may be configured on a first RAN and another of which may be configured on a second RAN. Thus, as illustrated in FIG. 5, the first radio protocol stack 500 may include a first RLC layer 504a, a first MAC layer 506a, and a first PHY layer 508a, each of which may be configured for the first RAN. Similarly, the first radio protocol stack 500 may include a second RLC layer 504b, a second MAC layer 506b, and a second PHY layer 508b, each of which may be configured for the second RAN. For example, one carrier may be configured on an LTE RAN, and another carrier may be configured on a 5G NR RAN.

When the transmitting apparatus is to send data or control information to the receiving apparatus, an SDU 520 may be received at the PDCP layer 502. The SDU 520 may be packaged as a PDU 522a, 522b that may be split over two bearers (e.g., an LTE bearer and a 5G NR bearer). One PDU 522a may be provided to the lower layers 504a, 506a, 508a of the first radio protocol stack 500 configured on the first RAN, while another PDU 522b may be provided to the lower layers 504b, 506b, 508b of the first radio protocol stack 500 configured on the second RAN. The PDUs 522a, 522b may then be transmitted to the receiving apparatus via both the first and second RANs on at least one channel 510 configured for communication with the receiving apparatus.

The second radio protocol stack 550 may allow carrier aggregation for communication with a receiving apparatus. Carrier aggregation may include at least two carriers of the same RAN on which the transmitting apparatus may communicate with the receiving apparatus. For example, carrier aggregation may include two carriers of a 5G NR RAN or an LTE RAN. The at least two carriers may be either contiguous or non-contiguous.

When the transmitting apparatus is to send data or control information to the receiving apparatus, an SDU 570 may be received at the PDCP layer 552. The SDU 570 may be packetized in a PDU 572a, 572b that may be split over at least two bearers, each of which may be configured for communication with the receiving apparatus on at least one channel 560 of the RAN.

One PDU 572a may be provided to the RLC_1 layer 554a (e.g., the RLC layer configured for a first carrier of the at least two carriers), and another PDU 572b may be provided to the RLC_2 layer 554b (e.g., the RLC layer configured for a second carrier of the at least two carriers). The RLC_1 layer 554a and the RLC_2 layer 554b may each provide a respective PDU 572a, 572b to a MAC layer 556. The MAC layer 556 may provide one PDU 572a to a PHY layer 558b configured for the first carrier and, further, may provide the other PDU 572b to a PHY layer 558b configured for the second carrier. The PDUs 572a, 572b may then be transmitted to the receiving apparatus via the at least two carriers on at least one channel 560 configured for communication with the receiving apparatus.

While both dual connectivity and carrier aggregation may improve some aspects of communication between apparatuses, such as by increasing throughput speed and/or amount, some issues may arise when dual connectivity or carrier aggregation are configured in practice. In some scenarios, dual connectivity and carrier aggregation may be relatively inefficient and/or wasteful when sending PDUs. For example, sending the same set of PDUs over each of the at least two carriers may increase the overhead associated with over-the-air signaling, as well as processing and/or transmission. Further, the receiving apparatus may discard duplicate PDUs (regardless of which carrier the PDU is received on), thereby increasing the wastefulness of PDU duplication.

This redundancy of PDUs by the PDCP layers 502, 552 over each of the at least two carriers may be wasteful because at least approximately twice as many resources may be consumed at the PHY layer(s) 508*a-b,* 558*a-b* and the MAC layer(s) 506*a-b,* 556. The consumption (and potential waste) of resources on PHY layer(s) 508*a-b,* 558*a-b* and/or MAC layer(s) 506*a-b,* 556 due to PDU duplication at the PDCP layers 502, 552 may be increased when channel conditions (e.g., physical channel conditions) between the transmitting apparatus and receiving apparatus are relatively poor (e.g., requiring additional retransmissions).

In addition, out-of-order PDU delivery to the receiving apparatus from the transmitting apparatus when duplicating PDCP PDUs for dual connectivity and/or carrier aggregation may increase latency. Such a latency increase may be detrimental to URLLC and/or other low-latency services or use cases.

According to various aspects, encoding a dataset from at least one SDU 520, 570 using fountain coding may mitigate one or more of the aforementioned issues potentially arising due to dual connectivity and/or carrier aggregation, such as by reducing wastefulness and/or decreasing latency due to out-of-order PDU delivery. For example, encoding a dataset from at least one SDU 520, 570 using fountain coding may obviate the need for in-order PDU delivery because fountain coding may not rely on in-order reception of PDUs. In addition, the overhead associated with over-the-air signaling and/or computational processing may be reduced because the total size of the PDUs received by the receiving apparatus may be only slightly larger than the total sizes of the original PDUs generated by the transmitting apparatus. Further, wastefulness may be reduced because all the received PDUs may be used for decoding by the receiving apparatus, regardless of the carrier on which a PDU is received.

Figure 6:
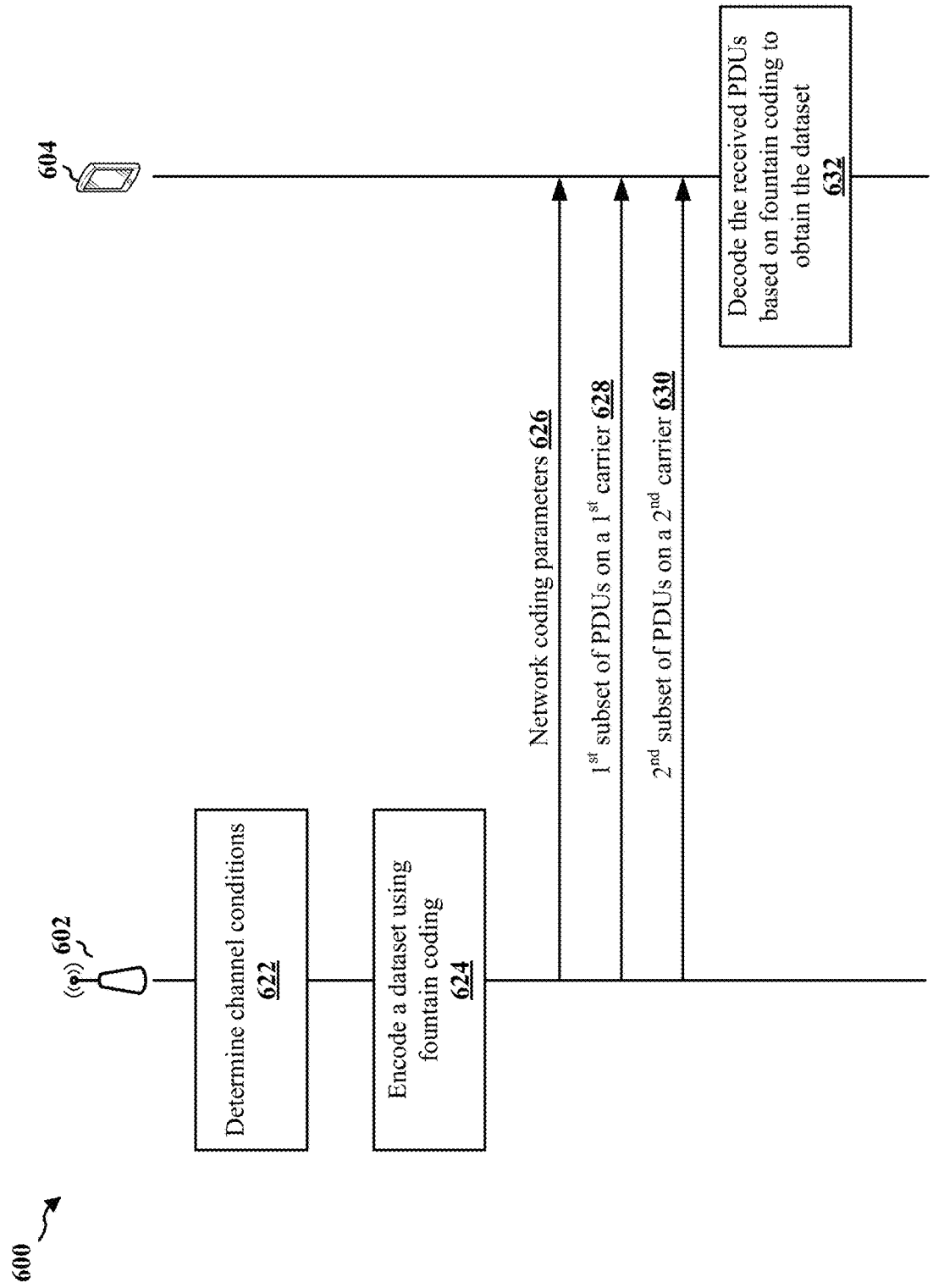
FIG. 6 is a call flow diagram illustrating a wireless communications system.

FIG. 6 is a call flow diagram illustrating a wireless communications system 600. The wireless communications system 600 may include, inter alia, a base station 602 and a UE 604. The base station 602 and the UE 604 may be configured to communicate on at least two carriers. In one aspect, the at least two carriers may be configured with the same RAN (e.g., a 5G NR RAN, an LTE RAN, etc.) for carrier aggregation. In another aspect, a first of the at least two carriers may be configured with a first RAN (e.g., a 5G NR RAN), whereas a second of the at least two carriers may be configured with a second RAN that is different from the first (e.g., an LTE RAN) for dual connectivity.

The base station 602 may determine 622 the channel conditions associated with each of the at least two carriers. For example, the base station 602 may determine (e.g., measure, receive, etc.) at least one value indicative of channel conditions on a first carrier configured with the UE 604 and, similarly, the base station 602 may determine (e.g., measure, receive, etc.) at least one value indicative of channel conditions on a second carrier configured with the UE 604. The at least one value indicative of channel conditions may include at least one of a reference signal receive power (RSRP), a reference signal receive quality (RSRQ), a signal-to-noise ratio (SNR), and/or another value.

In some aspects, the base station 602 may determine 622 the channel conditions associated with each of the at least two carriers based on information provided by the UE 604. For example, the UE 604 may receive a first set of signals (e.g., reference signals) from the base station 602 on a first carrier of the at least two carriers and, similarly, may receive a second set of signals (e.g., reference signals) from the base station 602 on a second carrier of the at least two carriers.

The UE 604 may determine (e.g., measure, estimate, etc.) at least one value indicative of channel conditions on the first carrier configured with the base station 602 based on receiving the first set of signals from the base station 602 on the first carrier. Additionally, the UE 604 may determine (e.g., measure, estimate, etc.) at least one value indicative of channel conditions on the second carrier configured with the base station 602 based on receiving the second set of signals from the base station 602 on the second carrier. Examples of each of the at least one values indicative of channel conditions on the first carrier and the second carrier may include at least one of an RSRP, an RSRQ, an SNR, and/or another value indicative of channel conditions on a carrier.

The UE 604 may send each of the at least one values indicative of channel conditions on the first carrier and the second carrier to the base station 602. Based on the received values indicative of channel conditions on the first and second carriers, the base station 602 may determine 622 channel conditions associated with each of the first carrier and the second carrier.

In determining the channel conditions associated with the first and second carriers, the base station 602 may determine (e.g., select, identify, etc.) which carrier of the at least two carriers is associated with the "best" channel conditions. For example, the base station 602 may compare a first value indicative of channel conditions on the first carrier with a second value indicative of channel conditions on the second carrier. The base station 602 may determine which of the first and second values is indicative of the best channel conditions based on the comparison.

For example, the base station 602 may determine which of the first and second values is the highest, and the base station 602 may determine that the carrier associated with the highest one of the first and second values is associated with the best channel conditions. A relatively higher value may indicate relatively better channel conditions, for example, when SNRs, RSRPs, and/or RSRQs are used as the values indicative of channel quality. However, other metrics may be used to determine which of the at least two carriers is associated with the best channel conditions.

In some aspects, the base station 602 and the UE 604 may be configured for one or more different services or use cases. For example, the base station 602 and the UE 604 may be configured for URLLC and/or another type of relatively low-latency and/or relatively high-reliability service or use case. Network coding, for example, using fountain coding, may be well-suited for URLLC and/or other types of relatively low-latency and/or relatively high-reliability services or use cases. Thus, the base station 602 may determine whether to encode a dataset from at least one SDU using fountain coding.

The base station 602 may determine whether to encode the dataset from the at least one SDU based on one or more conditions associated with communication with the UE 604. In one aspect, the base station 602 may determine whether to encode the dataset from the at least one SDU based on the service or use case configured with the UE 604. For example, when the UE 604 is configured for URLLC services with the base station 602, the base station 602 may determine that network coding may be applied to a dataset to be sent to the UE 604 according to URLLC.

Additionally or alternatively, the base station 602 may determine whether to encode the dataset from the at least one SDU based on whether dual connectivity and/or carrier aggregation is configured for communication with the UE 604. For example, when the UE 604 is configured for dual connectivity and/or carrier aggregation, the base station 602 may determine that network coding may be applied to the dataset to be sent to the UE 604 on each of at least two carriers with which the UE 604 is configured for dual connectivity and/or carrier aggregation.

In some further aspects, the base station 602 may determine whether to encode the dataset from the at least one SDU based on the channel conditions or channel quality on which the base station 602 and the UE 604 communicate. For example, when the base station 602 determines that the channel conditions are relatively poor, then the base station 602 may determine that network coding may be applied to the dataset to be sent to the UE 604.

The base station 602 may determine whether the channel conditions are relatively poor by comparing at least one value indicative of channel conditions (e.g., an RSRP measurement, an RSRQ measurement, an SNR measurement, etc.) to a threshold. If the at least one value indicative of the channel conditions fails to satisfy the threshold (e.g., the at least one value does not meet or does not exceed the threshold), then the base station 602 may determine that the channel conditions are relatively poor.

When the base station 602 determines that the dataset from the at least one SDU is to be encoded using fountain coding, then the base station 602 may encode 624 the dataset using fountain coding. The base station 602 may encode 624 the dataset using fountain coding based on the channel conditions determined for each of the at least two carriers on which communication with the UE 604 is configured.

Figure 7:
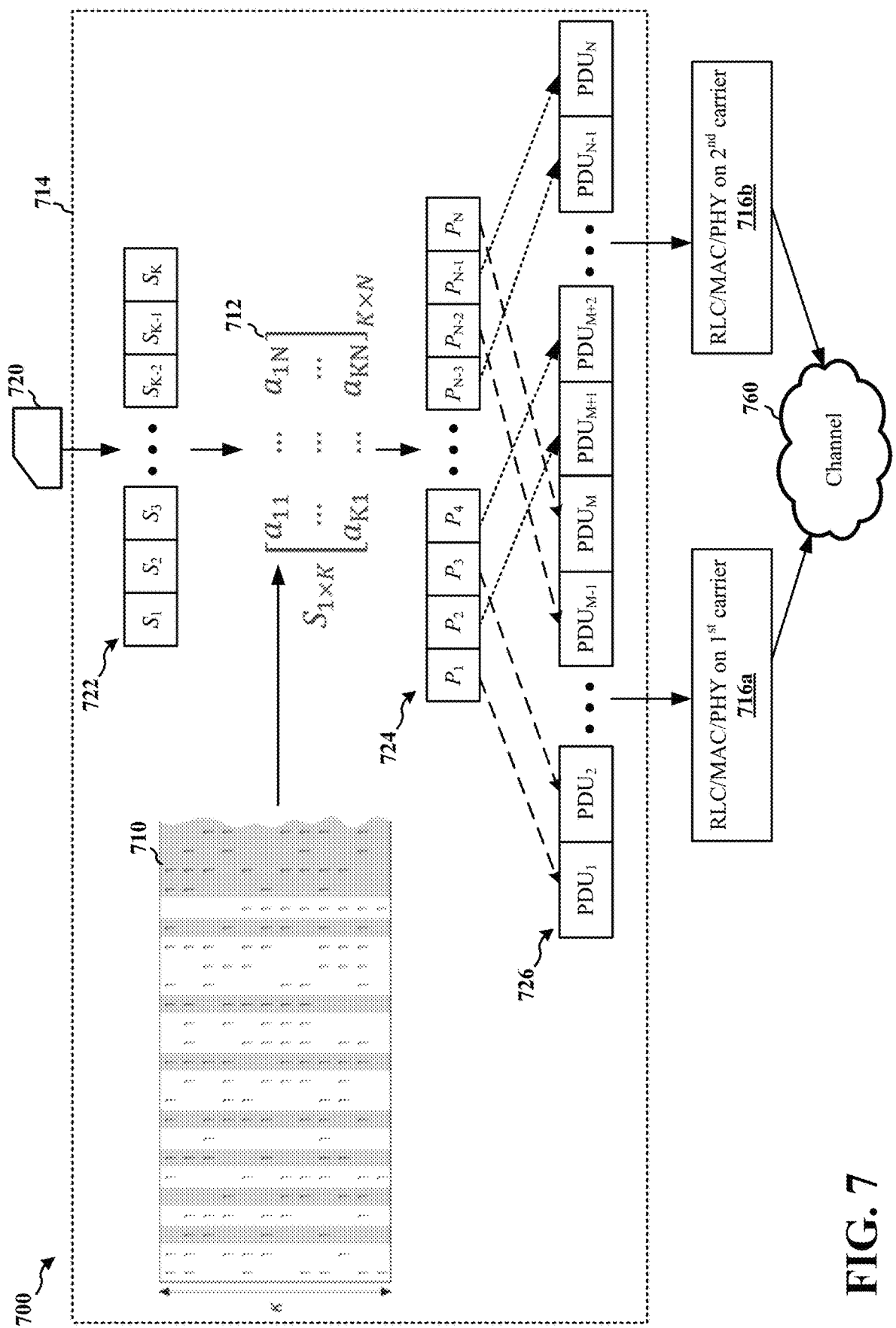
FIG. 7 is a diagram illustrating a system for encoding a dataset using fountain coding.

FIG. 7 illustrates a communications system 700 for encoding a dataset using fountain coding. Initially, the base station 602 may obtain an SDU 720 at a PDCP layer 714 of the base station 602. For example, in the context of FIG. 5, a PDCP layer 502 configured for dual connectivity or a PDCP layer 552 configured for carrier aggregation may obtain the SDU 720.

In order to encode the dataset included in the SDU 720, the base station 602 may determine a mother generator matrix G 710. In one aspect, the base station 602 may generate the mother generator matrix G 710 based on one or more standards and/or technical specifications (TSs) promulgated by Third Generation Partnership Project (3GPP). The one or more standards and/or TSs promulgated by 3GPP may indicate one or more parameters and/or one or more rules associated with generation of the mother generator matrix G 710, such as a number of rows K or one or more rules for determining the number of rows K.

According to various aspects, the base station 602 may determine the mother generator matrix G 710 by seeding or populating the mother generator matrix G 710. For example, the base station 602 may begin with a unit matrix when generating the mother generator matrix G 710, such as when ARQ feedback is conventionally configured between the base station 602 and the UE 604.

As founding coding allows for a potentially unlimited sequence of encoding bits or symbols that can be generated from the original bits or symbols of the original dataset of the SDU 720, the mother generator matrix 710 may include a relatively large, and potentially infinite, number of columns. For the efficiency of network coding, however, a matrix used for encoding the dataset may be a submatrix of the mother generator matrix 710. Thus, the base station 602 may determine a generator matrix G 712 as a submatrix of the mother generator matrix 710. As a submatrix of the mother generator matrix 710, the generator matrix G 712 may be the first N rows and each of the K columns of the mother generator matrix 710.

In some aspects, the base station 602 may determine the number of columns N for the generator matrix G 712 based on the channel conditions determined for each of the at least two carriers. For example, the base station 602 may determine a relatively greater number of columns N when the channel conditions for at least one of the at least two carriers are relatively poor and, correspondingly, the base station 602 may determine a relatively fewer number of columns N when the channel conditions for at least one of the at least two carriers are relatively good.

Additionally, the base station 602 may determine the number of rows K for the generator matrix G 712 based on the size of the SDU 720 (e.g., the size of the dataset included in the SDU 720 to be encoded). For example, the base station 602 may optimize the number of rows K based on the size of the SDU 720 and based on the generator matrix G 712.

In order to encode the dataset of the SDU 720, the base station 602 may divide the dataset included in the SDU 720 into K data blocks 722 (e.g., each of the data blocks 722 may be an entry of the dataset included in the SDU 720). Each of the K data blocks 722 may be of equal size, and K may be optimized using the size of the SDU 720 and the mother generator matrix 710.

Subsequently, the base station 602 may encode the K data blocks 722 into N packets 724 using the generator matrix G 712. For example, the base station 602 may obtain each encoded packet $p_j$ of the N packets 724 by multiplying each data block entry $s_k$ of the K data blocks 722 with each entry of a column of the generator matrix 712 that corresponds to an index j of the packet $p_j$. Each encoded packet $p_j$ may be equal to $\Sigma_{k=1}^{K} s_k G_{kj}$, as described with respect to Equation 1, supra.

The base station 602 may encode the K data blocks 722 into the N packets 724 at a PDCP layer of the base station 602. For example, the PDCP layer 714 may encode the K data blocks 722 into the N packets 724 for dual connectivity or for carrier aggregation.

A PDCP layer 714 of the base station 602, then, may include each of the N packets 724 in one of the N PDUs. While FIG. 7 illustrates an equal number of N packets 724 and N PDUs 726, the number of PDUs 726 may be less than N in some aspects, such as when the PDCP layer 714 allocates more than one of the N packets 724 into the same PDU of the PDUs 726.

As the base station 602 and the UE 604 may be configured to communicate on at least two carriers (e.g., for dual connectivity or carrier aggregation), the base station 602 may allocate one subset of the N packets 724 to the first carrier, and may allocate another subset of the N packets 724 to the second carrier. In order to allocate the subsets of the N packets 724 to one of the at least two carriers, the base station 602 may determine a number M of the first subset of N packets 724 to be allocated to the first carrier.

The base station 602 may determine M based on the channel conditions associated with each of the at least two carriers. For example, the base station 602 may determine which of the at least two carriers has "better" channel conditions (e.g., a highest SNR, a highest RSRP, a highest RSRQ, etc.). The base station 602 may then allocate a greater number of the N packets 724 to the one of the at least two carriers having the "better" channel conditions.

For example, when the first carrier of the at least two carriers has "better" channel conditions than the second carrier of the at least two carriers, the base station 602 may determine M to be greater than N/2. Similarly, when the second carrier of the at least two carriers has "better"

channel conditions than the first carrier of the at least two carriers, the base station 602 may determine M to be less than N/2. If the channel conditions of each of the at least two carriers is relatively equal (e.g., within a threshold margin), then the base station 602 may determine M to be N/2 (e.g., if N is odd, then M may be equal to $\lfloor N/2 \rfloor$ or $\lceil N/2 \rceil$).

Referring back to FIG. 6, the base station 602 may send a set of network coding parameters 626 to the UE 604 so that the UE 604 may decode the N packets 724 to be received in the first and second subsets of PDUs 628, 630. The base station 602 may send the set of network coding parameters 626 to the UE 604 via RRC signaling.

The set of network coding parameters 626 may include, for example, the number of rows K of the generator matrix G 712, the number of columns N of the generator matrix G 712, and/or the value of M to indicate the respective numbers of the N packets 724 to be sent on the first and second carriers. In some other aspects, the set of network coding parameters 626 may include the mother generator matrix 710 and/or information for determining (e.g., generating) the mother generator matrix 710.

The base station 602 may interlace the allocation of the N packets 724 across each of the at least two carriers. For example, the base station 602 may alternately allocate each of the N packets 724 to the first and second carriers—e.g., each of the N packets 724 that is associated with an odd index (e.g., $p_1$, $p_3$, etc.) may be allocated to the first carrier, while each of the N packets 724 that is associated with an even index (e.g., $p_2$, $p_4$, etc.) may be allocated to the second carrier.

The PDCP layer 714 of the base station 602 may include each of the N packets 724 in one of the N PDUs 726. For example, the PDCP layer 714 of the base station 602 may allocate a first packet $p_1$ into a first $PDU_1$, and then may allocate a second packet $p_2$ into an M+1 $PDU_{M+1}$. Continuing, the PDCP layer 714 of the base station 602 may allocate a third packet $p_3$ into a second $PDU_2$, and then may allocate a fourth packet $p_4$ into an M+2 $PDU_{M+2}$, and so forth until each of the N packets 724 has been allocated to either a first subset of PDUs indexed from 1 to M or a second subset of PDUs indexed from M+1 to N.

The N PDUs 726 may then be provided to the RLC/MAC/PHY layers 716a-b for transmission on one of the at least two carriers. For example, the PDCP layer 714 of the base station 602 may allocate a first subset of the N PDUs 726 to the first carrier. Accordingly, the PDCP layer 714 may provide the first subset of PDUs indexed from 1 to M to the RLC/MAC/PHY layers 716a on the first carrier of the at least two carriers. Similarly, the PDCP layer 714 may provide the second subset of PDUs indexed from M+1 to N to the RLC/MAC/PHY layers 716b on the second carrier of the at least two carriers.

The base station 602 may therefore send the N PDUs 726 to the UE 604 on the at least two carriers. For example, referring again to FIG. 6, the base station 602 may send the first subset of PDUs 628, indexed from 1 to M, to the UE 604 on the first carrier, and may send the second subset of PDUs 630, indexed from M+1 to N, to the UE 604 on the second carrier.

In order to indicate to the UE 604 that network coding has been applied to the N packets 724 included in the N PDUs 726, the base station 602 may include information in a header of each of the N PDUs 726. In some aspects, a PDU header may include a 12-bit sequence number or an 18-bit sequence number. To indicate that network coding is applied to a PDU, the base station 602 may include an additional bit or byte in the header of each PDU, such as after the 12-bit or 18-bit sequence number. For example, the base station 602 may include 1 bit (e.g., an "enable" bit) in the header of a PDU that is set to "1" when the PDU includes a network encoded packet but is set to "0" when the PDU does not include a network encoded packet (e.g., the PDU includes the original data block from the SDU).

In other aspects, the base station 602 may include a sub-sequence number in the header of a PDU that indicates an index corresponding to the encoded packet(s) included in that PDU. Such an index (or sub-sequence number) may allow the UE 604 to recover the order of the original data blocks when the encoded packet(s) in the PDU are decoded. The index (or sub-sequence number) may be 7 bits, which allows for 128 unique indexes (e.g., a maximum value of N may be 128).

In a further aspect, the sub-sequence number may be extended using 3 reserved bits in the header of a PDU. Together with the 7-bit sub-sequence number, the 3 reserved bits may allow for 1024 unique indexes. For example, a maximum value of N may be 1024 when both the 7-bit sub-sequence number and the 3 reserved bits are used to indicate the index associated with the encoded packet(s) in a PDU.

As the base station 602 may continue to generate PDUs to be sent to the UE 604, the base station 602 may dynamically adjust the allocation of encoded packets (e.g., the N packets 724) between each of the at least two carriers. For example, as channel conditions on one or more of the at least two carriers change, the base station 602 may dynamically adjust the value of M so that a greater number of encoded packets are allocated to the carrier having the "better" channel conditions. According to different aspects, the base station 602 may periodically adjust the value of M, the base station 602 may adjust the value of M for each SDU obtained at the PDCP layer 714 of the base station 602, the base station 602 may adjust the value of M when channel conditions on at least one of the at least two carriers changes by a threshold amount, etc.

The UE 604 may receive the first subset of PDUs 628, indexed from 1 to M, from the base station 602 on the first carrier, and may receive the second subset of PDUs 630, indexed from M+1 to N, from the base station 602 on the second carrier. The UE 604 may then decode 632 the first and second subsets of PDUs 628, 630 to obtain to obtain the original dataset from the SDU 720 encoded by the base station 602.

According to various aspects, the UE 604 may decode each of the first and second subsets of PDUs 628, 630 by extracting, from each PDU of the first and second subsets of PDUs 628, 630, a respective encoded packet. Each of the encoded packets extracted from the first and second subsets of PDUs 628, 630 may correspond to the N packets 724 encoded by the PDCP layer 714 of the base station 602. The UE 604 may decode each of the N packets included in the first and second subsets of PDUs 628, 630 to obtain the original dataset from the K data blocks 722.

In order to decode the packets included in the first and second subsets of PDUs 628, 630, the UE 604 may determine the generator matrix G 712. For example, the set of network coding parameters 626 may indicate the mother generator matrix 710, the number of rows K, the number of columns N, and/or the generator matrix G 712. In some aspects, the mother generator matrix 710 may be defined by at least one standard or TS promulgated by 3GPP and, therefore, the mother generator matrix 710 (and/or a set of rules for generating the mother generator matrix 710) may be preconfigured in the UE 604.

The UE 604 may use the inverse $G^{-1}$ of the generator matrix G 712 to decode each of the packets included in each of the first and second subsets of PDUs 628, 630. For example, the UE 604 may obtain each decoded data block $d_k$ by multiplying each encoded packet $p_n$ included in the first and second subsets of PDUs 628, 630 with each entry of a column of the inverse $G^{-1}$ generator matrix G 712 that corresponds to an index k of the data block $d_k$ to be recovered. Each decoded data block $d_k$ to may be equal to $\Sigma_{n=1}^{N} p_n G_{nk}^{-1}$, as described with respect to Equation 2, supra. The UE 604 (e.g., a PDCP layer of the UE 604) may then provide each of the decoded data blocks (corresponding to the K data blocks 722) to a higher layer of the UE 604 (e.g., an application layer or a higher layer of a radio protocol stack).

The UE 604 may determine that the first and second subsets of PDUs 628, 630 are encoded (and therefore are to be decoded by the UE 604) based on the "enable" bit being set to "1" in each header of each of the first and second subsets of PDUs 628, 630. Further, the UE 604 may recover the order of the decoded data blocks based on the sub-sequence number included in each header of each of the first and second subsets of PDUs 628, 630.

According to this approach to network coding, the efficiency of PDU communication between the base station 602 and the UE 604 may be improved because the total size of the PDUs received by the UE 604 may be only slightly larger than the size of the original PDUs without encoding and, further, the number of transmitted PDUs may be only slightly larger than the number of PDUs needed for decoding. In addition, the latency of PDU communication between the base station 602 and the UE 604 may be reduced because there may be no requirement on the ordering of the received PDUs and all the received PDUs may be used for decoding.

Figure 8:
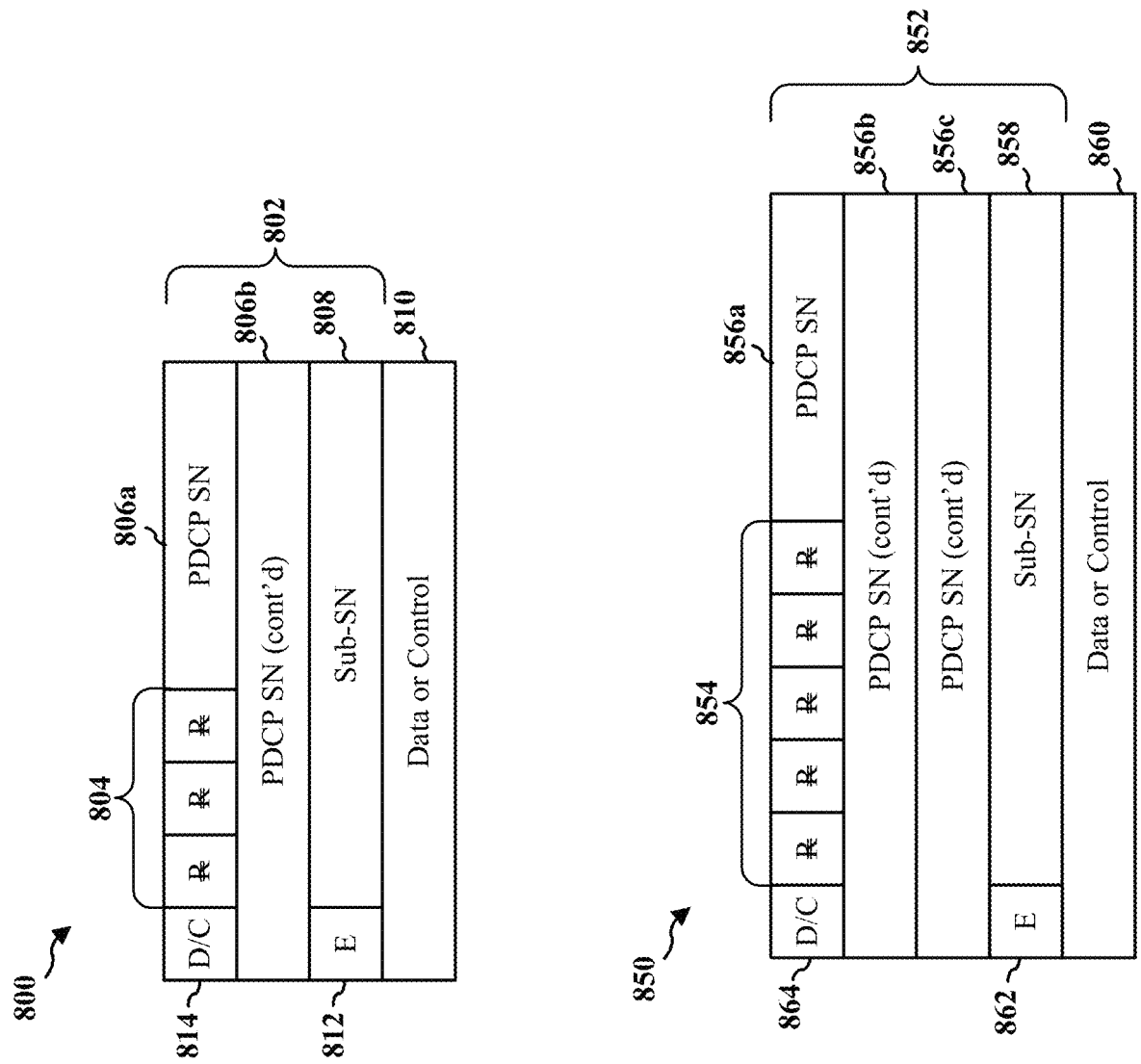
FIG. 8 is a block diagram illustrating PDUs, which may be fountain encoded.

FIG. 8 is a block diagram illustrating PDUs 800, 850, which may be fountain encoded, as described herein. The PDUs 800, 850 may be PDCP PDUs generated by a PDCP layer of a transmitting apparatus (e.g., the base station 102/180, 310, 602). The PDUs 800, 850 may be configured to indicate whether fountain coding has been applied to the contents of PDUs 800, 850.

Each of the PDUs 800, 850 may include a respective header 802, 852. The headers 802, 852 of the PDUs 800, 850 may include some fields in common. Specifically, the PDUs 800, 850 may each include a respective data/control (D/C) field 804, 854, a respective set of reserved bits 804, 854, and a PDCP SN field 806*a-b*, 856*a-c*. The first PDU 800 may include a PDCP SN field 806*a-b* that is configured to indicate a twelve bit sequence number, whereas the second PDU 850 may include a PDCP SN field 856*a-c* that is larger than the PDCP SN field 806*a-b* of the first PDU 800—e.g., the second PDU 850 may include a PDCP SN field 856*a-c* that is configured to indicate an eighteen bit sequence number.

Apart from the respective headers 802, 852, each of the PDUs 800, 850 may include a respective payload 810, 860. Each of the payloads 810, 860 may carry data or control information, which may correspond to the value of the respective D/C fields 814, 864.

In order to indicate to a receiving apparatus that fountain coding has been applied to the PDUs 800, 850, each of the PDUs 800, 850 may include a respective "enable" field 812, 864. Each enable field 812, 862 may include a value indicating whether the associated payload 810, 860 is encoded using fountain coding. For example, each of the enable fields 812, 862 may be one bit. The enable fields 812, 862 may be set to "1" to indicate that the associated payload 810, 860 is encoded using fountain coding or, alternatively, the enable fields 812, 862 may be set to "0" or null to indicate that the associated payload 810, 860 is not encoded.

When the payloads 810, 860 of the PDUs 800, 850 are encoded using fountain coding, the PDUs 800, 850 may be ordered by the receiving apparatus (e.g., when the PDUs 800, 850 are received with other PDUs of a sequence that may not be sequentially ordered when received). Accordingly, each of the PDUs 800, 850 may include a respective sub-SN field 808, 858.

The sub-SN fields 808, 858 may indicate a sequential ordering of one or more packets that are encoded using fountain coding and included in a respective one of the payloads 810, 860. For example, a PDCP layer of the transmitting apparatus may insert a value into one of the sub-SN fields 808, 858 that indicates the sequential ordering of one or more encoded packets included in the one of the payloads 810, 860 with respect to other encoded packets included in other PDUs.

In one aspect, each of the sub-SN fields 808, 858 may be configured to carry a sub-SN value of seven bits. With a seven-bit value in one of the sub-SN fields 808, 858, up to 128 packets may be accommodated for a maximum N. However, the sub-SN fields 808, 858 may be further extended to accommodate a greater number of sub-SN values. For example, the first PDU 800 may include a three reserved bits 804. The three reserved bits 804 may be repurposed to extend the sub-SN field 808 so that a larger number for a maximum N may be accommodated. In combination with the seven-bit sub-SN field 808, the three reserved bits 804 may configured to indicate 1024 sub-SN values for a maximum N.

Similarly, the reserved bits 854 of the second PDU 850 may be repurposed to extend the sub-SN field 858 so that a larger number for a maximum N may be accommodated. The second PDU 850, however, may include five reserved bits 858. Thus, in combination with the seven-bit sub-SN field 858, the five reserved bits 854 may configured to indicate 4096 sub-SN values for a maximum N.

Figure 9:
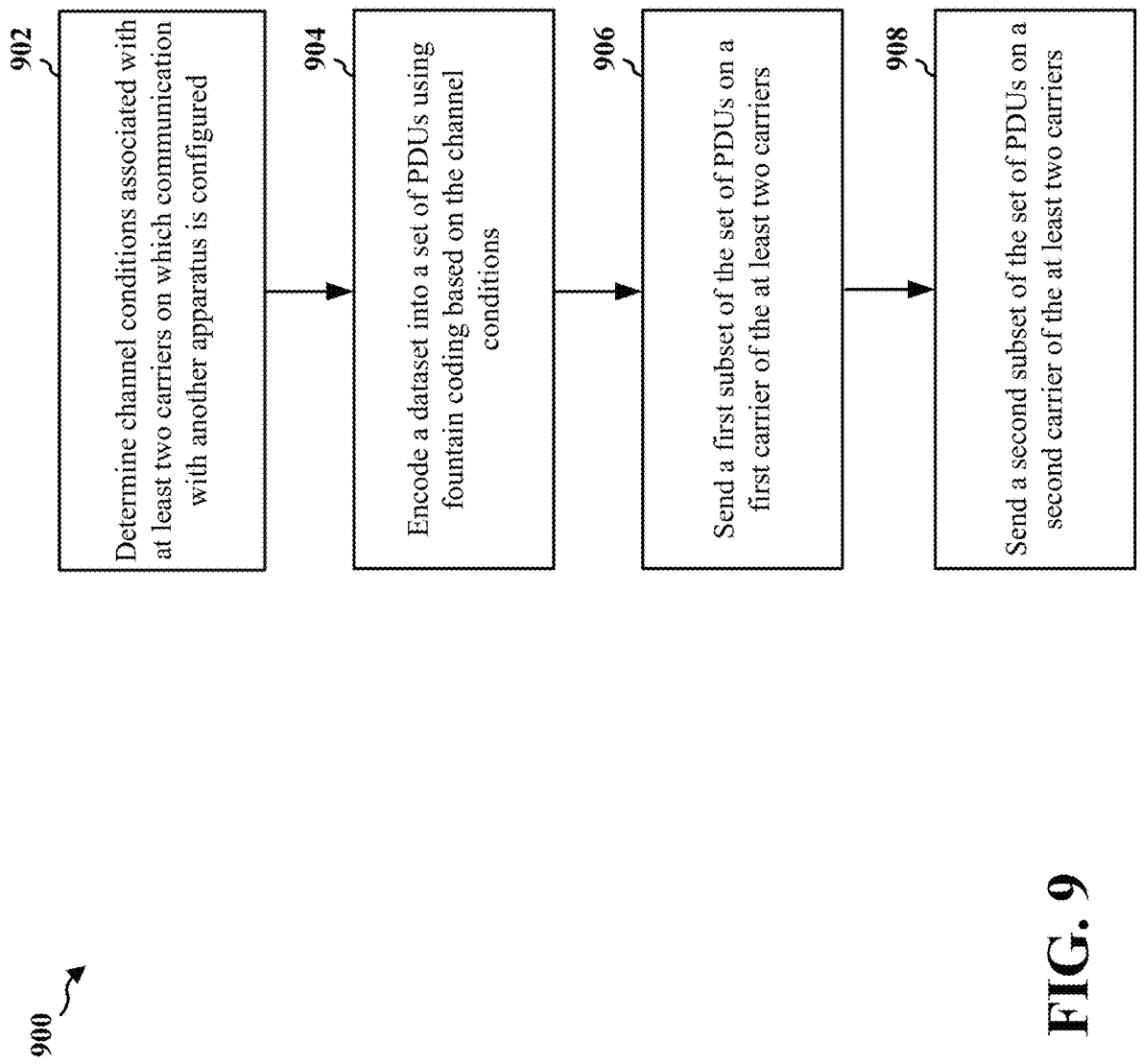
FIG. 9 is a flowchart of a first method of wireless communication.

FIG. 9 is a flowchart of a method 900 of wireless communication. The method 900 may be performed by a base station (e.g., the base station 102/180, 310, 602) and/or apparatus (e.g., the apparatus 1202 and/or an apparatus including the memory 376 and which may be the entire base station 310 or a component of the base station 310, such as the TX processor 316, the RX processor 370, and/or the controller/processor 375). According to different aspects, one or more of the illustrated operations may be omitted, transposed, and/or contemporaneously performed.

At block 902, the base station may determine channel conditions associated with at least two carriers on which communication with another apparatus is configured. For example, the base station may receive a set of reference signals from the other apparatus, and the base station may measure at least one value indicative of channel conditions (e.g., RSRP, SNR, etc.) based on receiving the set of reference signals. In another example, the base station may transmit a set of reference signals to the other apparatus, and the base station may receive information indicative of the channel conditions based on transmitting the set of reference signals. In one aspect, the first carrier may be an LTE carrier and the second carrier may be a 5G NR carrier (e.g., for dual connectivity with the other apparatus). In another aspect, the first carrier and the second carrier are configured for carrier aggregation on the same RAN (e.g., a 5G NR RAN). For example, referring to FIG. 6, the base station 602 may determine 622 channel conditions associated with at least two carriers on which communication with the UE 604 is configured.

At block 904, the base station may encode a data set into a set of PDUs using fountain coding based on the channel conditions. For example, the base station may determine a generator matrix G associated with fountain coding. A number of columns N of the generator matrix G may be determined based on the channel conditions and a number of rows K of the generator matrix G may be determined based on a size of the dataset. Further, the base station may determine a set of encoded packets based on each entry $s_k$ of the dataset and based on the generator matrix G, wherein each encoded packet $p_j$ of the set of encoded packets is equal to $\Sigma_{k=1}^{K} s_k G_{kj}$. The base station may include the set of encoded packets in the set of PDUs. For example, referring to FIGS. 6 and 7, the base station 602 may encode 624 a dataset from an SDU 720 into the set of N PDUs 726.

In some aspects, the base station may send, to the other apparatus, a set of network coding parameters. The set of network coding parameters may allow the other apparatus to decode the encoded packets in the set of PDUs. For example, the set of network coding parameters may include information indicating at least one of a mother generator matrix, the number of columns N of a generator matrix G, the number of rows K of the generator matrix G, and/or a number of PDUs M to be allocated to at least one of the at least two carriers. The base station may send the set of network coding parameters to the other apparatus via RRC signaling.

At block 906, the base station may send a first subset of the set of PDUs to the other apparatus on a first carrier of the at least two carriers. In some aspects, the base station may include, in a header of each PDU of the set of PDUs, information indicating the set of PDUs is encoded using fountain coding. In some other aspects, the base station may include, in a header of each PDU of the set of PDUs, information indicating an index corresponding to a subset of the dataset included in each PDU. For example, referring to FIG. 6, the base station 602 may send the first subset of PDUs 628 to the UE 604 on a first carrier of the at least two carriers.

At block 908, the base station may send a second subset of the set of PDUs to the other apparatus on a second carrier of the at least two carriers. For example, referring to FIG. 6, the base station 602 may send the second subset of PDUs 630 to the UE 604 on a second carrier of the at least two carriers.

Figure 10:
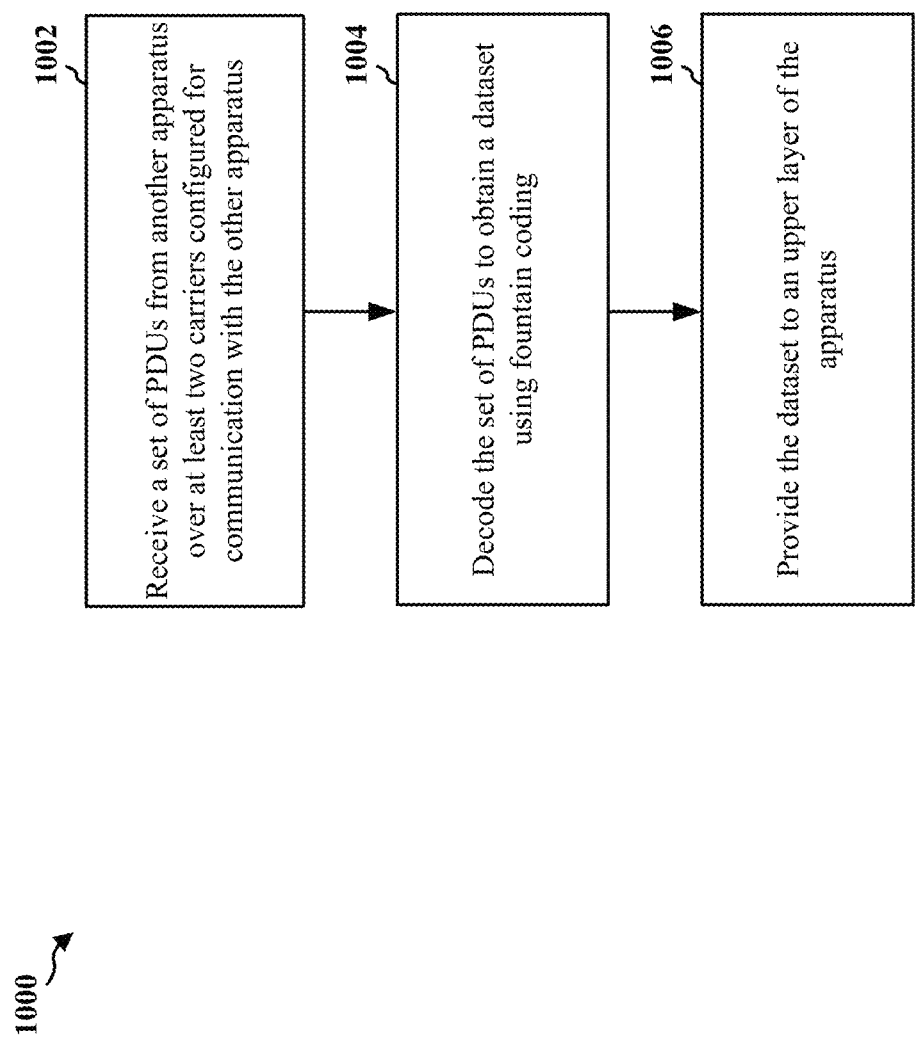
FIG. 10 is a flowchart of a second method of wireless communication.

FIG. 10 is a flowchart of a method 1000 of wireless communication. The method 1000 may be performed by a UE (e.g., the UE 104, 350, 604) and/or an apparatus (e.g., the apparatus 1102 and/or an apparatus including the memory 360 and which may be the entire UE 350 or a component of the UE 350, such as the TX processor 368, the RX processor 356, and/or the controller/processor 359). According to different aspects, one or more of the illustrated operations may be omitted, transposed, and/or contemporaneously performed At block 1002, the UE may receive a set of PDUs from another apparatus over at least two carriers configured for communication with the other apparatus. In some aspects, a header of each PDU of the set of PDUs may include information indicating the set of PDUs is encoded using fountain coding. In some other aspects, a header of each PDU of the set of PDUs may include information indicating an index corresponding to a subset (e.g., a data block) of the dataset included in each PDU. For example, referring to FIG. 6, the UE 604 may receive the first subset of PDUs 628 from the base station 602 on a first carrier of the at least two carriers and, similarly, may receive the second subset of PDUs 630 form the base station 602 on a second carrier of the at least two carriers.

At block 1004, the UE may decode the set of PDUs to obtain a dataset using fountain coding. For example, the UE may receive a set of network coding parameters, which may include information indicating a mother generator matrix, the number of columns N of a generator matrix G, the number of rows K of the generator matrix G, and/or a number of PDUs M to be allocated to at least one of the at least two carriers. The UE may receive the set of network coding parameters from the other apparatus via RRC signaling. The UE may use the set of network coding parameters for decoding the set of PDUs into the dataset.

In some aspects, the UE may determine the set of PDUs by first determining the generator matrix G using the set of network coding parameters. Next, the UE may determine a set of decoded packets based on each encoded packet $p_n$ included in the set of PDUs and based on an inverse of the generator matrix $G^{-1}$, wherein each decoded data block $d_k$ of the set of decoded packets is equal to $\Sigma_{n=1}^{N} p_n G_{nk}^{-1}$. The UE may obtain the dataset as each of the decoded data blocks.

At block 1006, the UE may provide the decoded dataset to an upper layer of the UE. For example, first, a PDCP layer of the UE may select a decoded dataset associated with a layer of the UE relatively higher than the PDCP layer (e.g., an application layer) and, second, the PDCP layer may send the decoded dataset to the higher layer of the UE (e.g., the application layer or another higher layer of the UE) based on the selection of the decoded dataset. For example, referring to FIG. 6, the UE 604 may provide the dataset, decoded from the first and second subsets of PDUs 628, 630, to an upper layer of the UE 604.

Figure 11:
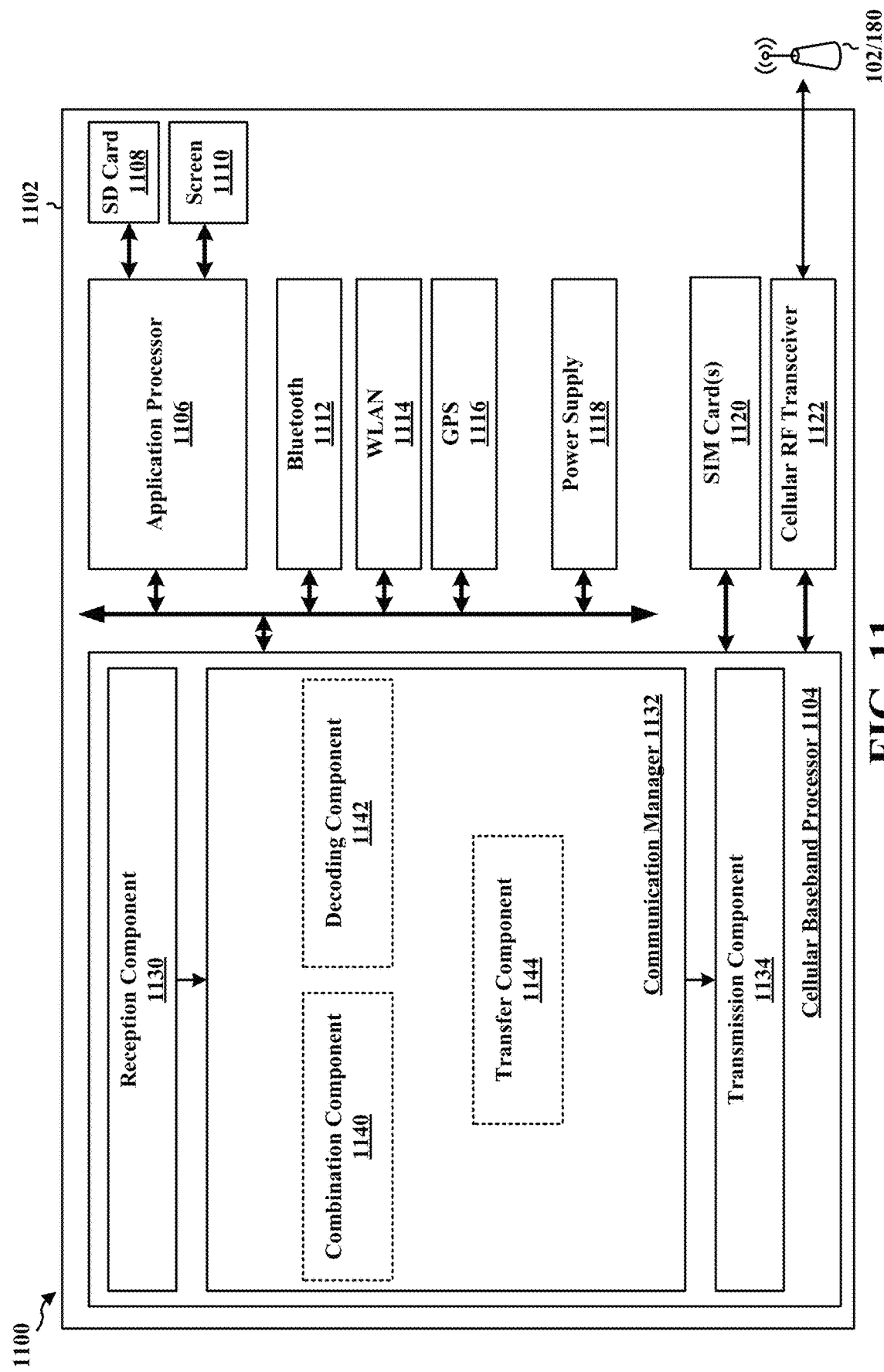
FIG. 11 is a diagram illustrating a first example of a hardware implementation for an example apparatus.

FIG. 11 is a diagram 1100 illustrating an example of a hardware implementation for an apparatus 1102. The apparatus 1102 is a UE and includes a cellular baseband processor 1104 (also referred to as a modem) coupled to a cellular RF transceiver 1122 and one or more subscriber identity modules (SIM) cards 1120, an application processor 1106 coupled to a secure digital (SD) card 1108 and a screen 1110, a Bluetooth module 1112, a wireless local area network (WLAN) module 1114, a Global Positioning System (GPS) module 1116, and a power supply 1118. The cellular baseband processor 1104 communicates through the cellular RF transceiver 1122 with the UE 104 and/or BS 102/180. The cellular baseband processor 1104 may include a computer-readable medium/memory. The computer-readable medium/memory may be non-transitory. The cellular baseband processor 1104 is responsible for general processing, including the execution of software stored on the computer-readable medium/memory. The software, when executed by the cellular baseband processor 1104, causes the cellular baseband processor 1104 to perform the various functions described supra. The computer-readable medium/memory may also be used for storing data that is manipulated by the cellular baseband processor 1104 when executing software. The cellular baseband processor 1104 further includes a reception component 1130, a communication manager 1132, and a transmission component 1134. The communication manager 1132 includes the one or more illustrated components. The components within the communication manager 1132 may be stored in the computer-readable medium/memory and/or configured as hardware within the cellular baseband processor 1104. The cellular baseband processor 1104 may be a component of the UE 350 and may include the memory 360 and/or at least one of the TX processor 368, the RX processor 356, and the controller/processor 359. In one configuration, the apparatus 1102 may be a modem chip and include just the baseband processor 1104, and in another configuration, the apparatus 1102 may be the entire UE (e.g., see 350 of FIG. 3) and include the additional modules of the apparatus 1102, described supra.

The communication manager 1132 includes a combination component 1140 that is configured to receive a set of PDUs from the base station 102/180 over at least two carriers configured for communication with the base station 102/180, e.g., as described in connection with block 1002 of FIG. 10. For example, the reception component 1130 may receive a plurality of PDUs, and the combination component 1132 may aggregate or combine some or all of the received plurality of PDUs into a set of PDUs, which may be a set of related PDUs. For example, the combination component 1140 may aggregate or combine PDUs into a set based on information included in a respective header of each of the PDUs of the set, such as information indicating each of the PDUs is associated with a dataset that is encoded using fountain code.

The communication manager 1132 further includes a decoding component 1142 that receives input(s) based on the set of PDUs from the combination component 1140. The decoding component 1142 is configured to decode the set of PDUs to obtain a dataset using fountain coding, e.g., as described in connection with block 1004 of FIG. 10.

For example, the decoding component 1142 may be configured to determine a generator matrix G. Next, the decoding component 1142 may determine a set of decoded packets based on each encoded packet $p_n$ included in the set of PDUs and based on an inverse of the generator matrix $G^{-1}$, wherein each decoded data block $d_k$ of the set of decoded packets is equal to $\Sigma_{n=1}^{N} p_n G_{nk}^{-1}$. The decoding component 1142 may obtain the dataset as each of the decoded data blocks.

In some aspects, the reception component 1130 may receive a set of network coding parameters from the base station 102/180 (e.g., via RRC signaling), and the reception component 1130 may provide input(s) to the decoding component 1142 based on the set of network coding parameters. The decoding component 1142 may be configured to decode the set of PDUs to obtain the dataset using fountain coding based on the set of network coding parameters. For example, the set of network coding parameters may include the aforementioned generator matrix G and/or may include information associated therewith, such as a number of rows and/or a number of columns of the generator matrix G.

The communication manager 1132 further includes a transfer component 1144 that receives input(s) based on the dataset obtained from the set of PDUs decoded using fountain coding from the decoding component 1142. The transfer component 1144 is configured to provide the dataset to an upper layer of the apparatus 1102, e.g., as described in connection with block 1006 of FIG. 10. For example, the transfer component 1144 may transfer the dataset from a PDCP layer of the apparatus 1102 to a relatively higher layer, such as an application layer or other layer 3 layer.

The apparatus may include additional components that perform each of the blocks of the algorithm in the aforementioned flowchart of FIG. 10. As such, each block in the aforementioned flowchart of FIG. 10 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1102, and in particular the cellular baseband processor 1104, includes means for receiving a set of PDUs from another apparatus over at least two carriers configured for communication with the other apparatus; means for decoding the set of PDUs to obtain a dataset using fountain coding; and means for providing the dataset to an upper layer of the apparatus 1102.

In one aspect, a first carrier of the at least two carriers includes an LTE carrier and a second carrier of the at least two carriers comprises a 5G NR carrier. In one aspect, the at least two carriers are configured for carrier aggregation on a RAN.

In one aspect, the means for decoding the set of PDUs to obtain a dataset using fountain coding is configured to determine a generator matrix G associated with the fountain coding; and determine a set of decoded data blocks based on each encoded packet $p_n$ included in the set of PDUs and based on an inverse of the generator matrix $G^{-1}$, such that each decoded data block $d_k$ of the set of decoded data blocks is equal to $\Sigma_{n=1}^{N} p_n G_{nk}^{-1}$, and the dataset includes the set of decoded data blocks.

In one aspect, the apparatus 1102, and in particular the cellular baseband processor 1104, further includes means for receiving, from the other apparatus, information indicating the generator matrix.

In one aspect, the apparatus 1102, and in particular the cellular baseband processor 1104, further includes means for receiving, from the other apparatus, information indicating at least one of a number of rows of the generator matrix, a number of columns of the generator matrix, a number of a first subset of PDUs to be received over a first carrier of the at least two carriers, or a number of a second set of PDUs to be received over a second carrier of the at least two carriers.

In one aspect, a header of each PDU of the set of PDUs includes information indicating the set of PDUs is encoded using the fountain code. In one aspect, a header of each PDU of the set of PDUs includes information indicating an index corresponding to a subset of the dataset included in each PDU.

The aforementioned means may be one or more of the aforementioned components of the apparatus 1102 configured to perform the functions recited by the aforementioned means. As described supra, the apparatus 1102 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 12:
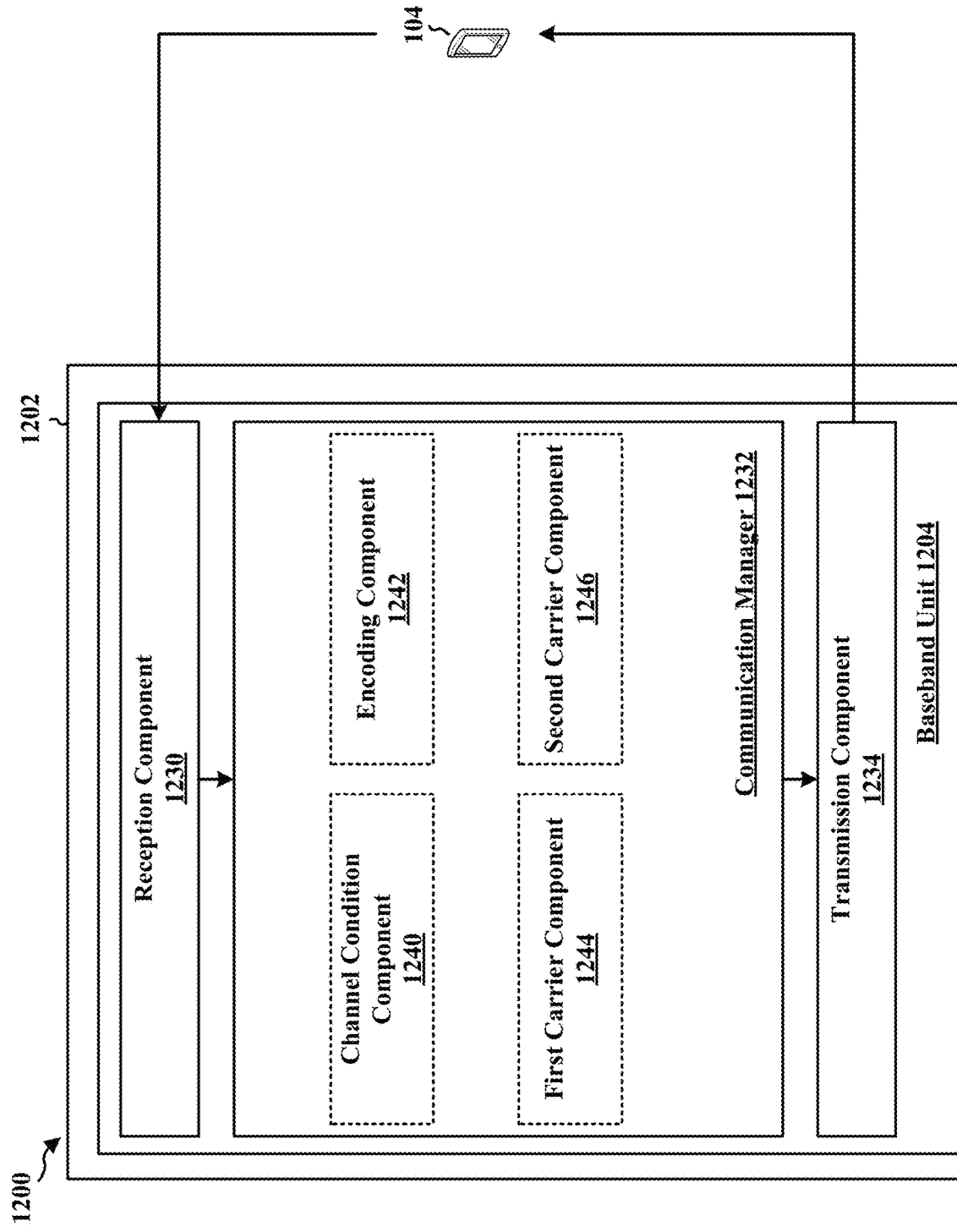
FIG. 12 is a diagram illustrating a second example of another hardware implementation for another example apparatus.

FIG. 12 is a diagram 1200 illustrating an example of a hardware implementation for an apparatus 1202. The apparatus 1202 is a BS and includes a baseband unit 1204. The baseband unit 1204 may communicate through a cellular RF transceiver with the UE 104. The baseband unit 1204 may include a computer-readable medium/memory. The baseband unit 1204 is responsible for general processing, including the execution of software stored on the computer-readable medium/memory. The software, when executed by the baseband unit 1204, causes the baseband unit 1204 to perform the various functions described supra. The computer-readable medium/memory may also be used for storing data that is manipulated by the baseband unit 1204 when executing software. The baseband unit 1204 further includes a reception component 1230, a communication manager 1232, and a transmission component 1234. The communication manager 1232 includes the one or more illustrated components. The components within the communication manager 1232 may be stored in the computer-readable medium/memory and/or configured as hardware within the baseband unit 1204. The baseband unit 1204 may be a component of the BS 310 and may include the memory 376 and/or at least one of the TX processor 316, the RX processor 370, and the controller/processor 375.

The communication manager 1232 includes a channel condition component 1240 that is configured to determine channel conditions associated with at least two carriers on which communication with the UE 104 is configured, e.g., as described in connection with block 902 of FIG. 9.

The communication manager 1232 further includes an encoding component 1242 that receives input(s) based on the channel conditions from the channel condition component 1240. The encoding component 1242 is configured to encode a data set into a set of PDUs using fountain coding based on the channel conditions, e.g., as described in connection with block 904 of FIG. 9.

In some aspects, For example, the encoding component 1242 may determine a generator matrix G associated with fountain coding. A number of columns N of the generator matrix G may be determined based on the channel conditions and a number of rows K of the generator matrix G may be determined based on a size of the dataset. Further, the encoding component 1242 may determine a set of encoded packets based on each entry $s_k$ of the dataset and based on the generator matrix G, wherein each encoded packet $p_j$ of the set of encoded packets is equal to $\Sigma_{k=1}^{K} s_k G_{kj}$. The encoding component 1242 may include the set of encoded packets in the set of PDUs.

The communication manager 1232 further includes a first carrier component 1244 and a second carrier component 1246. The first carrier component 1244 may be associated with an LTE carrier, whereas the second carrier component 1246 may be associated with a 5G NR carrier. The first carrier component 1244 and the second carrier component 1246 may be configured for carrier aggregation on a RAN.

The first carrier component 1244 may receive input(s) based on a first subset of the set of PDUs from the encoding component 1242. The first carrier component 1244 is configured to send the first subset of the set of PDUs to the UE 104 on a first carrier of at least two carriers, e.g., as described in connection with block 906 of FIG. 9.

The second carrier component 1246 may receive input(s) based on a second subset of the set of PDUs from the encoding component 1242. The second carrier component 1246 is configured to send the second subset of the set of PDUs to the UE 104 on a second carrier of the at least two carriers, e.g., as described in connection with block 908 of FIG. 9.

To that end, the transmission component 1234 may transmit the first and second subsets of the set of PDUs to the UE 104 over the first and second carriers, respectively. In some aspects, the transmission component 1234 may transmit, to the UE 104, a set of network coding parameters. The set of network coding parameters may allow the UE 104 to decode the encoded packets in the set of PDUs. For example, the set of network coding parameters may include information indicating at least one of a mother generator matrix, the number of columns N of a generator matrix G, the number of rows K of the generator matrix G, and/or a number of PDUs M to be allocated to at least one of the at least two carriers. The transmission component 1234 may transmit the set of network coding parameters to the UE 104 via RRC signaling.

The apparatus may include additional components that perform each of the blocks of the algorithm in the aforementioned flowchart of FIG. 9. As such, each block in the aforementioned flowchart of FIG. 9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1202, and in particular the baseband unit 1204, includes means for determining channel conditions associated with at least two carriers on which communication with another apparatus is configured; means for encoding a dataset into a set of PDUs using fountain coding based on the channel conditions; means for sending a first subset of the set of PDUs to the other apparatus on a first carrier of the at least two carriers; and means for sending a second subset of the set of PDUs to the other apparatus on a second carrier of the at least two carriers.

In one aspect, the first carrier includes an LTE carrier and the second carrier includes a 5G NR carrier. In one aspect, the at least two carriers are configured for carrier aggregation on a RAN.

In one aspect, the means for encoding the dataset into a set of PDUs using fountain coding based on the channel conditions is configured to determine a generator matrix G associated with the fountain coding, where a number of columns N of the generator matrix G is determined based on the channel conditions and a number of rows K of the generator matrix G is determined based on a size of the dataset. The means for encoding the dataset into a set of PDUs using fountain coding based on the channel conditions is further configured to determine a set of encoded packets based on each entry $s_k$ of the dataset and based on the generator matrix G, such that each encoded packet $p_j$ of the set of encoded packets is equal to $\Sigma_{k=1}^{K} s_k G_{kj}$, and the set of encoded packets is included in the set of PDUs.

In one aspect, the apparatus 1202, and in particular the baseband unit 1204, further includes means for sending, to the other apparatus, information indicating the generator matrix. In one aspect, the apparatus 1202, and in particular the baseband unit 1204, further includes means for sending, to the other apparatus, information indicating at least one of the number of rows of the generator matrix, a number of columns of the generator matrix, a number of the first subset of PDUs, or a number of the second set of PDUs.

In one aspect, a number of the first subset of PDUs and a number of the second subset of PDUs are based on the channel conditions. In one aspect, the apparatus 1202, and in particular the baseband unit 1204, further includes means for adjusting the number of the first subset of PDUs and the number of the second subset of PDUs based on a change to the channel conditions.

In one aspect, a header of each PDU of the set of PDUs includes information indicating the set of PDUs is encoded using the fountain code. In one aspect, a header of each PDU of the set of PDUs includes information indicating an index corresponding to a subset of the dataset included in each PDU.

The aforementioned means may be one or more of the aforementioned components of the apparatus 1202 configured to perform the functions recited by the aforementioned means. As described supra, the apparatus 1202 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication by an apparatus, the method comprising:

determining channel conditions associated with at least two carriers on which communication with another apparatus is configured;

encoding a dataset into a set of protocol data units (PDUs) using fountain coding based on the channel conditions;

sending a first subset of the set of PDUs to the other apparatus on a first carrier of the at least two carriers;

sending a second subset of the set of PDUs to the other apparatus on a second carrier of the at least two carriers; and wherein the encoding the dataset into a set of PDUs using fountain coding based on the channel conditions comprises:

determining a generator matrix G associated with the fountain coding, wherein a number of columns N of the generator matrix G is determined based on the channel conditions and a number of rows K of the generator matrix G is determined based on a size of the dataset; and determining a set of encoded packets based on each entry $s_k$ of the dataset and based on the generator matrix G, wherein each encoded packet $p_j$ of the set of encoded packets is equal to $\Sigma_{k=1}^{K} s_k G_{kj}$, wherein the set of encoded packets is included in the set of PDUs.

2. The method of claim 1, wherein the first carrier comprises a Long Term Evolution (LTE) carrier and the second carrier comprises a 5G New Radio (NR) carrier.

3. The method of claim 1, wherein the at least two carriers are configured for carrier aggregation on a radio access network (RAN).

4. The method of claim 1, further comprising:
   sending, to the other apparatus, information indicating the generator matrix.

5. The method of claim 1, further comprising:
   sending, to the other apparatus, information indicating at least one of the number of rows of the generator matrix, a number of columns of the generator matrix, a number of the first subset of PDUs, or a number of the second set of PDUs.

6. The method of claim 1, wherein a number of the first subset of PDUs and a number of the second subset of PDUs are based on the channel conditions.

7. The method of claim 6, further comprising:
   adjusting the number of the first subset of PDUs and the number of the second subset of PDUs based on a change to the channel conditions.

8. The method of claim 1, wherein a header of each PDU of the set of PDUs includes information indicating the set of PDUs is encoded using the fountain code.

9. The method of claim 1, wherein a header of each PDU of the set of PDUs includes information indicating an index corresponding to a subset of the dataset included in each PDU.

10. An apparatus for wireless communication, comprising:
    a memory; and
    at least one processor coupled to the memory and configured to:
    determine channel conditions associated with at least two carriers on which communication with another apparatus is configured;
    encode a dataset into a set of protocol data units (PDUs) using fountain coding based on the channel conditions;
    send a first subset of the set of PDUs to the other apparatus on a first carrier of the at least two carriers;

send a second subset of the set of PDUs to the other apparatus on a second carrier of the at least two carriers; and wherein to encode the dataset into a set of PDUs using fountain coding based on the channel conditions comprises to:

determine a generator matrix G associated with the fountain coding, wherein a number of columns N of the generator matrix G is determined based on the channel conditions and a number of rows K of the generator matrix G is determined based on a size of the dataset; and determine a set of encoded packets based on each entry $s_k$ of the dataset and based on the generator matrix G, wherein each encoded packet $p_j$ of the set of encoded packets is equal to $\Sigma_{k=1}^{K} s_k G_{kj}$, wherein the set of encoded packets is included in the set of PDUs.

11. The apparatus of claim 10, wherein the first carrier comprises a Long Term Evolution (LTE) carrier and the second carrier comprises a 5G New Radio (NR) carrier.

12. The apparatus of claim 10, wherein the at least two carriers are configured for carrier aggregation on a radio access network (RAN).

13. The apparatus of claim 10, wherein the at least one processor is further configured to:
send, to the other apparatus, information indicating the generator matrix.

14. The apparatus of claim 10, wherein the at least one processor is further configured to:
send, to the other apparatus, information indicating at least one of the number of rows of the generator matrix, a number of columns of the generator matrix, a number of the first subset of PDUs, or a number of the second set of PDUs.

15. The apparatus of claim 10, wherein a number of the first subset of PDUs and a number of the second subset of PDUs are based on the channel conditions.

16. The apparatus of claim 15, wherein the at least one processor is further configured to:
adjust the number of the first subset of PDUs and the number of the second subset of PDUs based on a change to the channel conditions.

17. The apparatus of claim 10, wherein a header of each PDU of the set of PDUs includes information indicating the set of PDUs is encoded using the fountain code.

18. The apparatus of claim 10, wherein a header of each PDU of the set of PDUs includes information indicating an index corresponding to a subset of the dataset included in each PDU.

19. An apparatus for wireless communication, comprising:
a memory; and
at least one processor coupled to the memory and configured to:
receive a set of protocol data units (PDUs) from another apparatus over at least two carriers configured for communication with the other apparatus;
decode the set of PDUs to obtain a dataset using fountain coding;
provide the dataset to an upper layer of the apparatus; and
wherein to decode the set of PDUs to obtain a dataset using fountain coding comprises to:
determine a generator matrix G associated with the fountain coding; and determine a set of decoded data blocks based on each encoded packet $p_n$ included in the set of PDUs and based on an inverse of the generator matrix $G^{-1}$, wherein each decoded data block $d_k$ of the set of decoded data blocks is equal to $\Sigma_{n=1}^{N} p_n G_{nk}^{-1}$, wherein the dataset comprises the set of decoded data blocks.

20. The apparatus of claim 19, wherein a first carrier of the at least two carriers comprises a Long Term Evolution (LTE) carrier and a second carrier of the at least two carriers comprises a 5G New Radio (NR) carrier.

21. The apparatus of claim 19, wherein the at least two carriers are configured for carrier aggregation on a radio access network (RAN).

22. The apparatus of claim 19, wherein the at least one processor is further configured to:
receive, from the other apparatus, information indicating the generator matrix.

23. The apparatus of claim 19, wherein the at least one processor is further configured to:
receive, from the other apparatus, information indicating at least one of a number of rows of the generator matrix, a number of columns of the generator matrix, a number of a first subset of PDUs to be received over a first carrier of the at least two carriers, or a number of a second set of PDUs to be received over a second carrier of the at least two carriers.

24. The apparatus of claim 19, wherein a header of each PDU of the set of PDUs includes information indicating the set of PDUs is encoded using the fountain code.

25. The apparatus of claim 19, wherein a header of each PDU of the set of PDUs includes information indicating an index corresponding to a subset of the dataset included in each PDU.

26. An apparatus for wireless communication, comprising:
means for determining channel conditions associated with at least two carriers on which communication with another apparatus is configured;
means for encoding a dataset into a set of protocol data units (PDUs) using fountain coding based on the channel conditions;
means for sending a first subset of the set of PDUs to the other apparatus on a first carrier of the at least two carriers;
means for sending a second subset of the set of PDUs to the other apparatus on a second carrier of the at least two carriers; and
wherein the means for encoding the dataset into a set of PDUs using fountain coding based on the channel conditions is configured to:
determine a generator matrix G associated with the fountain coding, wherein a number of columns N of the generator matrix G is determined based on the channel conditions and a number of rows K of the generator matrix G is determined based on a size of the dataset; and
determine a set of encoded packets based on each entry $S_k$ of the dataset and based on the generator matrix G, wherein each encoded packet $p_j$ of the set of encoded packets is equal to $\Sigma_{k=1}^{K} s_k G_{kj}$,
wherein the set of encoded packets is included in the set of PDUs.

27. The apparatus of claim 26, wherein the first carrier comprises a Long Term Evolution (LTE) carrier and the second carrier comprises a 5G New Radio (NR) carrier.

28. The apparatus of claim 26, wherein the at least two carriers are configured for carrier aggregation on a radio access network (RAN).

29. The apparatus of claim 26, further comprising:
means for sending, to the other apparatus, information indicating the generator matrix.

30. The apparatus of claim 26, further comprising:
means for sending, to the other apparatus, information indicating at least one of the number of rows of the generator matrix, a number of columns of the generator matrix, a number of the first subset of PDUs, or a number of the second set of PDUs.

31. A non-transitory computer-readable medium storing computer-executable code for wireless communication by an apparatus, the code when executed by a processor cause the processor to:
determine channel conditions associated with at least two carriers on which communication with another apparatus is configured;
encode a dataset into a set of protocol data units (PDUs) using fountain coding based on the channel conditions;
send a first subset of the set of PDUs to the other apparatus on a first carrier of the at least two carriers;
send a second subset of the set of PDUs to the other apparatus on a second carrier of the at least two carriers; and
wherein the encode the dataset into a set of PDUs using fountain coding based on the channel conditions comprises:
determine a generator matrix G associated with the fountain coding, wherein a number of columns N of the generator matrix G is determined based on the channel conditions and a number of rows K of the generator matrix G is determined based on a size of the dataset; and
determine a set of encoded packets based on each entry $s_k$ of the dataset and based on the generator matrix G, wherein each encoded packet $p_j$ of the set of encoded packets is equal to $\Sigma_{k=1}^{K} s_k G_{kj}$,
wherein the set of encoded packets is included in the set of PDUs.

* * * * *